(12) United States Patent
Lee

(10) Patent No.: US 12,476,233 B2
(45) Date of Patent: Nov. 18, 2025

(54) DISPLAY DEVICE

(71) Applicant: SAMSUNG DISPLAY CO., LTD., Yongin-si (KR)

(72) Inventor: Yo Han Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 462 days.

(21) Appl. No.: 18/000,673

(22) PCT Filed: May 31, 2021

(86) PCT No.: PCT/KR2021/006761
§ 371 (c)(1),
(2) Date: Dec. 2, 2022

(87) PCT Pub. No.: WO2021/246741
PCT Pub. Date: Dec. 9, 2021

(65) Prior Publication Data
US 2023/0230968 A1    Jul. 20, 2023

(30) Foreign Application Priority Data

Jun. 4, 2020 (KR) .................. 10-2020-0067699

(51) Int. Cl.
*H01L 25/16* (2023.01)
*H10H 20/831* (2025.01)
*H10H 20/85* (2025.01)

(52) U.S. Cl.
CPC ......... *H01L 25/167* (2013.01); *H10H 20/831* (2025.01); *H10H 20/8506* (2025.01)

(58) Field of Classification Search
CPC .. H10H 20/857; H10H 20/831; H10H 20/032; H10H 20/0364; H10H 20/83;
(Continued)

(56) References Cited

U.S. PATENT DOCUMENTS 8,188,476 B2    5/2012  Takagi et al.
10,672,946 B2   6/2020  Cho et al.
(Continued)

FOREIGN PATENT DOCUMENTS

CN    103035665 A    4/2013
CN    110137200 A    8/2019
(Continued)

OTHER PUBLICATIONS

International Search Report of PCT/KR2021/006761, Sep. 14, 2021, 5 pp.
(Continued)

*Primary Examiner* — Mark W Tornow
*Assistant Examiner* — Priya M Rampersaud
(74) *Attorney, Agent, or Firm* — Womble Bond Dickinson (US) LLP

(57) ABSTRACT

A display device is provided. The display device includes a plurality of pixels disposed in a display area, each of the plurality of pixels includes a first electrode and a second electrode spaced apart from each other in a first direction, and at least one light emitting element disposed between the first electrode and the second electrode and electrically connected to the first electrode and the second electrode, and a distance in the first direction between one end of the light emitting element and one end of the second electrode is greater than a distance in the first direction between another end of the light emitting element and one end of the first electrode.

20 Claims, 23 Drawing Sheets

(58) Field of Classification Search
CPC .................. H01L 24/24; H10D 86/441; G09G 2300/0426; G09G 2300/0465
See application file for complete search history.

(56) References Cited

U.S. PATENT DOCUMENTS

| | | |
|---|---|---|
| 11,074,858 B2 | 7/2021 | Cho et al. |
| 11,114,500 B2 | 9/2021 | Lee et al. |
| 11,888,092 B2 | 1/2024 | Jung et al. |
| 11,908,845 B2* | 2/2024 | Woo .................. H10H 20/857 |
| 12,068,356 B2 | 8/2024 | Li et al. |
| 12,255,223 B2 | 3/2025 | Im et al. |
| 2004/0142502 A1 | 7/2004 | Yoo et al. |
| 2013/0168708 A1 | 7/2013 | Shibata et al. |
| 2018/0294254 A1 | 10/2018 | Chen et al. |
| 2021/0217738 A1* | 7/2021 | Bae .................. H10H 20/857 |
| 2021/0265324 A1 | 8/2021 | Kong et al. |
| 2021/0288217 A1 | 9/2021 | Li et al. |
| 2022/0052031 A1* | 2/2022 | Kang .................. H01L 24/24 |
| 2022/0223760 A1 | 7/2022 | Im et al. |

FOREIGN PATENT DOCUMENTS

| | | |
|---|---|---|
| CN | 110890383 A | 3/2020 |
| KR | 10-2018-0007376 A | 1/2018 |
| KR | 10-2020-0010704 A | 1/2020 |
| KR | 10-2020-0010706 A | 1/2020 |
| KR | 10-2020-0041429 A | 4/2020 |
| KR | 10-2020-0138479 A | 12/2020 |
| KR | 10-2021-0029337 A | 3/2021 |
| WO | WO 2012-008253 A1 | 1/2012 |
| WO | WO 2020/075939 A1 | 4/2020 |

OTHER PUBLICATIONS

Written Opinion of International Searching Authority for PCT/KR2021/006761, Sep. 14, 2021, 5 pp. with English translation.

* cited by examiner

DISPLAY DEVICE

CROSS-REFERENCE TO RELATED APPLICATIONS

This application is a U.S. National Phase Patent Application of International Patent Application Number PCT/KR2021/006761, filed on May 31, 2021, which claims priority to Korean Patent Application Number 10-2020-0067699, filed on Jun. 4, 2020, the entire content of all of which is incorporated herein by reference.

TECHNICAL FIELD

The present disclosure relates to a display device.

BACKGROUND ART

As interest in information display increases and a demand for using a portable information medium increases, a demand and commercialization for a display device are focused.

DETAILED DESCRIPTION

An aspect of the present disclosure provides a display device capable of a bias alignment and a center alignment of a light emitting element using a single alignment signal (or alignment voltage).

The present disclosure is not limited to the aspect described above, and other aspects that are not described will be clearly understood by those skilled in the art from the following description.

According to one or more embodiments of the present disclosure, a display device includes a plurality of pixels disposed in a display area, each of the plurality of pixels includes a first electrode and a second electrode spaced apart from each other in a first direction, and at least one light emitting element disposed between the first electrode and the second electrode and electrically connected to the first electrode and the second electrode, and a distance in the first direction between one end of the light emitting element and one end of the second electrode is greater than a distance in the first direction between another end of the light emitting element and one end of he first electrode.

A width in the first direction of the second electrode may be greater than a width in the first direction of the first electrode.

The light emitting element may include a first semiconductor layer, a second semiconductor layer, and an active layer disposed between the first semiconductor layer and the second semiconductor layer, the first semiconductor layer may be electrically connected to the second electrode, and the second semiconductor layer may be electrically connected to the first electrode.

The first semiconductor layer may overlap the second electrode, and the second semiconductor layer may overlap the first electrode.

An area in which the second electrode overlaps the first semiconductor layer may be greater than an area in which the first electrode overlaps the second semiconductor layer.

A distance in the first direction between the active layer and the one end of the first electrode may be substantially the same as a distance in the first direction between the active layer and the one end of the second electrode.

The plurality of the pixels may further include a first bank pattern disposed under the first electrode and overlapping the first electrode, and a second bank pattern disposed under the second electrode and overlapping the second electrode.

A distance in the first direction between the one end of the second electrode and one end of the second bank pattern may be greater than a distance in the first direction between the one end of the first electrode and one end of the first bank pattern.

A distance in the first direction between the one end of the light emitting element and one end of the second bank pattern may be substantially the same as a distance in the first direction between the other end of the light emitting element and one end of the first bank pattern.

The light emitting element may include a first semiconductor layer, a second semiconductor layer, and an active layer disposed between the first semiconductor layer and the second semiconductor layer, and a distance in the first direction between one end of the second bank pattern and the active layer may be greater than a distance in the first direction between one end of the first bank pattern and the active layer.

According to one or more other embodiments of the present disclosure, a display device may include a plurality of pixels disposed in a display area, each of the plurality of pixels may include a first electrode and a second electrode spaced apart from each other in a first direction, at least one intermediate electrode disposed between the first electrode and the second electrode, a first light emitting element disposed between the intermediate electrode and the first electrode, and a second light emitting element disposed between the intermediate electrode and the second electrode, and an area in which the intermediate electrode and the first light emitting element overlap may be greater than an area in which the intermediate electrode and the second light emitting element overlap.

Each of the first light emitting element and the second light emitting element may include a first semiconductor layer, a second semiconductor layer, and an active layer disposed between the first semiconductor layer and the second semiconductor layer.

The intermediate electrode may overlap the first semiconductor layer of the first light emitting element.

The intermediate electrode may overlap the second semiconductor layer of the second light emitting element.

A distance in the first direction between one end of the intermediate electrode and one end of the first semiconductor layer of the first light emitting element may be greater than a distance in the first direction between another end of the intermediate electrode and one end of the second semiconductor layer of the second light emitting element.

A distance in the first direction between one end of the intermediate electrode and the active layer of the first light emitting element may be substantially the same as a distance in the first direction between another end of the intermediate electrode and the active layer of the second light emitting element.

The plurality of pixels may further include a bank pattern disposed under the intermediate electrode.

A distance in the first direction between the one end of the intermediate electrode and one end of the bank pattern may be greater than a distance in the first direction between the other end of the intermediate electrode and another end of the bank pattern.

A distance in the first direction between one end of the bank pattern and one end of the first light emitting element may be substantially the same as a distance in the first direction between another end of the bank pattern and one end of the second light emitting element.

Each of the first light emitting element and the second light emitting element may include a first semiconductor layer, a second semiconductor layer, and an active layer disposed between the first semiconductor layer and the second semiconductor layer, a distance in the first direction between the active layer of the first light emitting element and one end of the bank pattern may be greater than a distance in the first direction between the active layer of the second light emitting element and another end of the bank pattern.

The details of other embodiments are included in the detailed description and drawings.

According to embodiments, light emitting elements may be centrally aligned using a single alignment signal by designing an alignment electrode asymmetrically. That is, since a separate center alignment signal may be omitted, an alignment signal may be simplified, and a contact area between the light emitting element and a contact electrode may be stably secured through a center alignment.

The present disclosure is not limited by the contents exemplified above, and more various aspects are included in the present specification.

MODE FOR INVENTION

Figure 1:
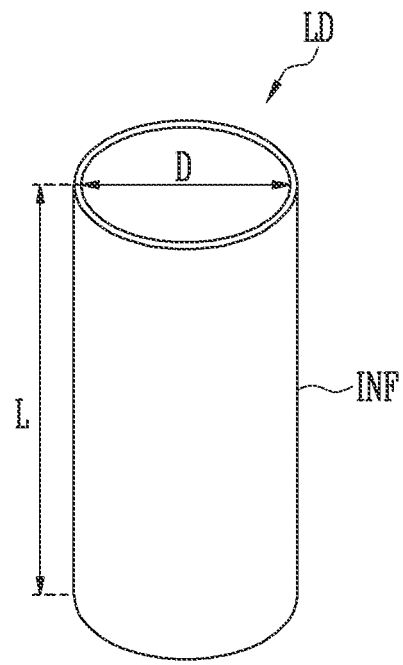
FIGS. 1 to 6 are perspective views and cross-sectional views illustrating a light emitting element according to one or more embodiments, respectively.

The above aspects and one or more methods of achieving them will become apparent with reference to the embodiments described in detail below together with the accompanying drawings. However, the present disclosure is not limited to the embodiments disclosed below, and may be implemented in various different forms, the present embodiments are provided so that the disclosure is thorough and complete and those skilled in the art to which the present disclosure pertains can fully understand the scope of the disclosure, and the present disclosure is only defined by the scope of the claims.

A case in which an element or a layer is referred to as "on" another element or layer includes a case in which another layer or another element is disposed directly on the other element or between the other layers. The same reference numeral refers to the same reference component throughout the specification.

Although a first, a second, and the like are used to describe various components, these components are not limited by these terms. These terms are used only to distinguish one component from another component. Therefore, a first component described below may be a second component within the technical spirit. The singular expression includes a plural expression unless the context clearly dictates otherwise.

Hereinafter, embodiments are described in detail with reference to the accompanying drawings. The same or similar reference numerals are used for the same components in the drawings.

FIGS. 1 to 6 are perspective views and cross-sectional views illustrating a light emitting element according to one or more embodiments, respectively.

FIGS. 1 to 6 show a cylindrical rod-shaped light emitting element LD, but a type and/or a shape of the light emitting element LD are/is not limited thereto.

Figure 2:
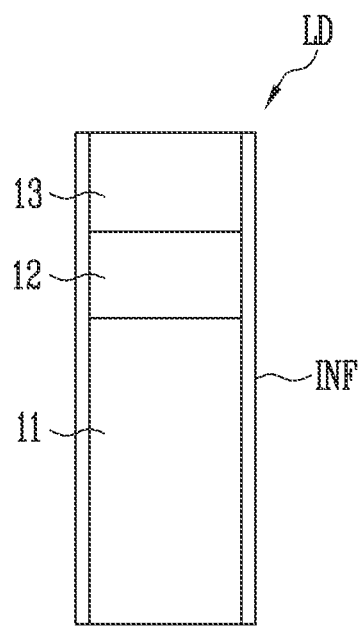

First, referring to FIGS. 1 and 2, the light emitting element LD according to one or more embodiments includes a first semiconductor layer 11 and a second semiconductor layer 13, and an active layer 12 interposed between the first and second semiconductor layers 11 and 13. For example, the light emitting element LD may include the first semiconductor layer 11, the active layer 12, and the second semiconductor layer 13 sequentially stacked along a length L direction.

According to one or more embodiments, the light emitting element LD may be provided in a rod shape extending along one direction. When an extension direction of the light emitting element LD is referred to as the length L direction, the light emitting element LD may have one side end and another side end along the length L direction.

According to one or more embodiments, one of the first and second semiconductor layers 11 and 13 may be disposed at the one side end of the light emitting element LD. In addition, the other one of the first and second semiconductor layers 11 and 13 may be disposed at the other side end of the light emitting element LD.

According to one or more embodiments, the light emitting element LD may be a rod-shaped light emitting diode manufactured in a rod shape. In the present specification, the term "rod-shaped" encompasses a rod-like shape or a bar-like shape that is long (that is, having an aspect ratio greater than 1) in the length L direction, such as a circular column or a polygonal column, and a shape of a cross section thereof is not particularly limited. For example, a length L of the light emitting element LD may be greater than a diameter D (or a width of the cross section) thereof.

According to one or more embodiments, the light emitting element LD may have a size as small as a nano scale to a micro scale (nanometer scale to micrometer scale). For example, the light emitting element LD may have the diameter D and/or the length L of a nano scale to micro scale range, respectively. However, a size of the light emitting element LD is not limited thereto in the present disclosure. For example, the size of the light emitting element LD may be variously changed according to a design condition of various devices using a light emitting device using the light emitting element LD as a light source, for example, a display device.

The first semiconductor layer 11 may include, for example, at least one N-type semiconductor layer. For example, the first semiconductor layer 11 may include any one semiconductor material among InAlGaN, GaN, AlGaN, InGaN, AlN, and InN, and may include an N-type semiconductor layer doped with a first dopant such as Si, Ge, or Sn. However, a material configuring the first semiconductor layer 11 is not limited thereto, and various other materials may configure the first semiconductor layer 11.

The active layer 12 may be disposed on the first semiconductor layer 11 and may be formed in a single or mufti-quantum well (MQW) structure. In one or more embodiments, a clad layer doped with a conductive dopant may be formed on and/or under the active layer 12. For example, the dad layer may be formed of an AlGaN layer or an InAlGaN layer. According to one or more embodiments, a material of AlGaN, InAlGaN, or the like may be used to form the active layer 12, and various other materials may configure the active layer 12.

When a voltage equal to or greater than a threshold voltage is applied to both ends of the light emitting element LD, the light emitting element LD emits light while an electron-hole pair is combined in the active layer 12. By controlling emission of the light emitting element LD using such a principle, the light emitting element LD may be used as a light source of various light emitting devices including a pixel of a display device.

The second semiconductor layer 13 may be disposed on the active layer 12 and may include a semiconductor layer of a type different from that of the first semiconductor layer 11. For example, the second semiconductor layer 13 may include at least one P-type semiconductor layer. For example, the second semiconductor layer 13 may include at least one semiconductor material among InAlGaN, GaN, AlGaN, InGaN, AlN, and InN, and may include a P-type semiconductor layer doped with a second dopant such as Mg. However, a material configuring the second semiconductor layer 13 is not limited thereto, and various other materials may configure the second semiconductor layer 13.

Thicknesses of the first semiconductor layer 11, the active layer 12, and the second semiconductor layer 13 may be different from each other. Here, the thickness of the first semiconductor layer 11, the active layer 12, and the second semiconductor layer 13 may mean a thickness in the length L direction. In one or more embodiments, the thickness of the first semiconductor layer 11 may be greater than the thickness of the second semiconductor layer 13. Due to a thickness difference between the first semiconductor layer 11 and the second semiconductor layer 13, the active layer 12 may not be disposed at a center of the light emitting element LD. Therefore, when the light emitting element LD is aligned using a permanent dipole of the active layer 12, a center alignment of the light emitting element LD may not occur smoothly due to eccentricity of the active layer 12. Accordingly, the display device according to one or more embodiments may centrally align the light emitting element LD using a single alignment signal by designing an alignment electrode asymmetrically in consideration of the eccentricity of the active layer 12 in the light emitting element LD. A detailed description thereof is described later with reference to FIGS. 12 to 15.

The light emitting element LD may further include an insulating layer INF provided on a surface thereof. The insulating layer INF may be formed on the surface of the light emitting element LD to surround at least an outer circumferential surface of at least the active layer 12, and may further surround one area of the first and second semiconductor layers 11 and 13. However, the insulating layer INF may expose the respective ends of the light emitting element LD having different polarities. For example, the insulating layer INF may not cover and may expose one end of each of the first and second semiconductor layers 11 and 13 positioned at the respective ends of the light emitting element LD in the length L direction, for example, two bottom surfaces (an upper surface and a lower surface of the light emitting element LD in FIGS. 1 and 2) of a cylinder. In some other embodiments, the insulating layer INF may expose the respective ends of the light emitting element LD having different polarities and a side portion of the semiconductor layers 11 and 13 adjacent to the respective ends.

According to one or more embodiments, the insulating layer INF may include at least one insulating material among silicon nitride ($SiN_x$), silicon oxide ($SiO_x$), aluminum oxide ($AlO_x$), and titanium oxide ($TiO_x$), but is not limited thereto. That is, a configuration material of the insulating layer INF is not particularly limited, and the insulating layer INF may be formed of various currently known insulating materials.

In one or more embodiments, the light emitting element LD may further include an additional component in addition to the first semiconductor layer 11, the active layer 12, the second semiconductor layer 13 and/or the insulating layer INF. For example, the light emitting element LD may additionally include one or more phosphor layers, active layers, semiconductor layers, and/or electrode layers disposed on one end side of the first semiconductor layer 11 the active layer 12, and/or the second semiconductor layer 13.

Figure 3:
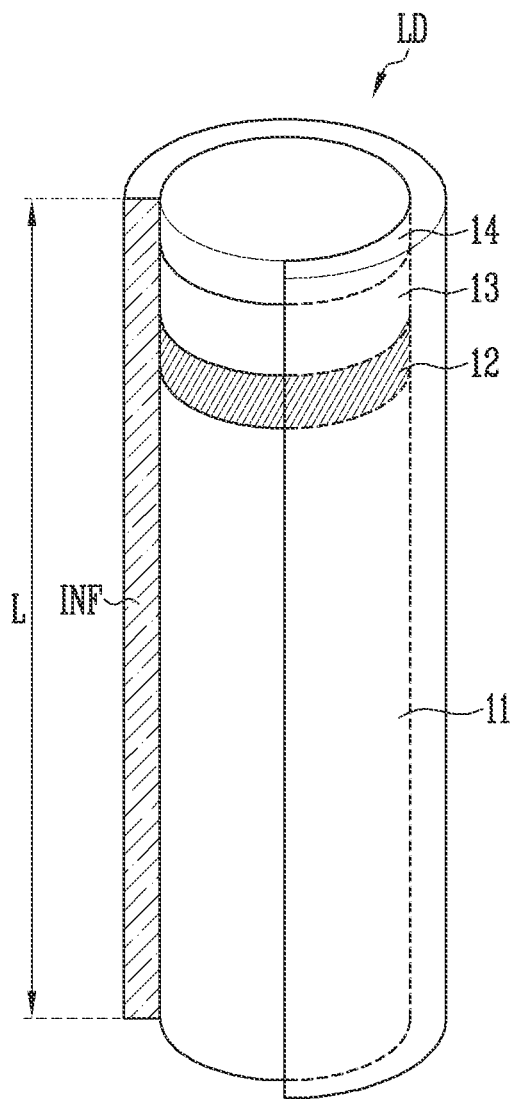
Figure 4:
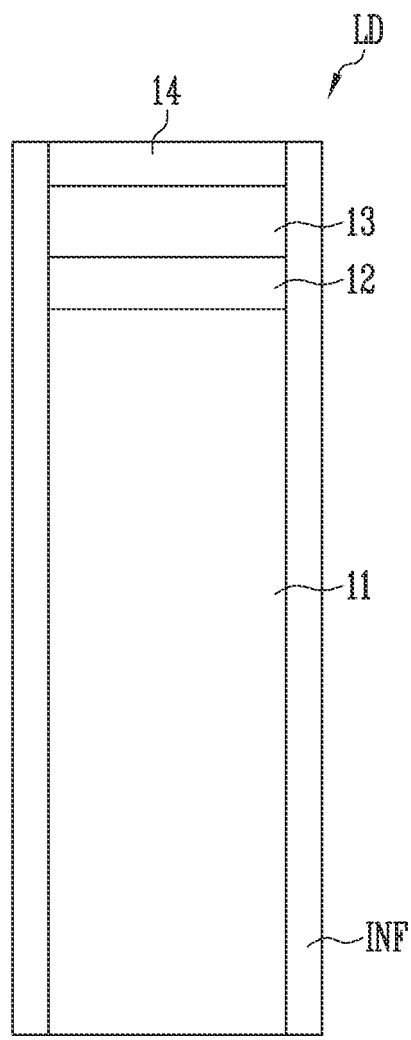
Figure 5:
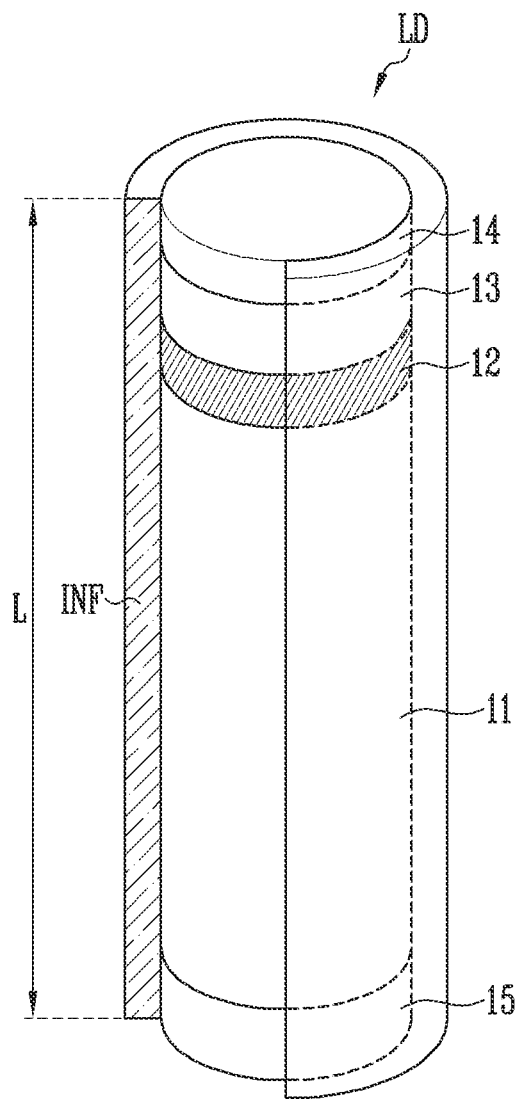
Figure 6:
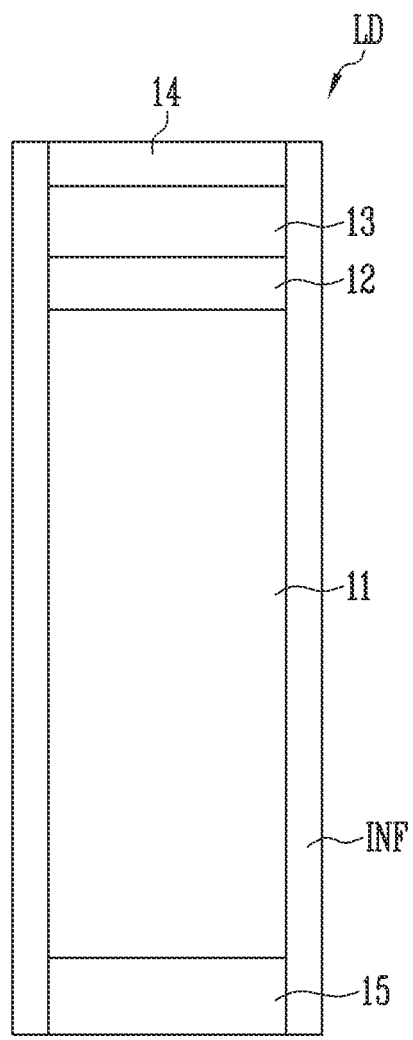

For example, the light emitting element LD may further include at least one additional electrode 14 disposed on one end side of the second semiconductor layer 13 as shown in FIGS. 3 and 4. In addition, according to one or more embodiments, the light emitting element LD may further include at least one other additional electrode 15 disposed on one end side of the first semiconductor layer 11 as shown in FIGS. 5 and 6. In FIGS. 3 and 5, a portion of the insulating layer INF is omitted for convenience of description.

Each of the additional electrodes 14 and 15 may be an ohmic contact electrode, but is not limited thereto. According to one or more embodiments, the additional electrodes 14 and 15 may be Schottky electrodes. In addition, each of the additional electrodes 14 and 15 may include a metal or a metal oxide. For example, each of the additional electrodes 14 and 15 may be formed using chromium (Cr), titanium (Ti), aluminum (Al), gold (Au), nickel (Ni), an oxide or an alloy thereof, a transparent electrode material such as indium tin oxide (ITO), indium zinc oxide (IZO), zinc oxide (ZnO), and indium tin zinc oxide (ITZO), and the like alone or in combination. In addition, according to one or more embodiments, the additional electrodes 14 and 15 may be substantially transparent or translucent. Accordingly, light generated from the light emitting element LD may pass through the additional electrodes 14 and 15 and may be emitted to an outside of the light emitting element LD.

According to one or more embodiments, the insulating layer INF may or may not at least partially surround an outer circumferential surface of the additional electrodes 14 and 15. That is, the insulating layer INF may be selectively formed on a surface of the additional electrodes 14 and 15. In addition, the insulating layer INF may be formed to expose the respective ends of the light emitting element LD having respective polarities, and for example, the insulating layer INF may expose at least one area of the additional electrodes 14 and 15. According to one or more embodiments, the insulating layer INF may have a curved shape in a corner area adjacent to the additional electrodes 14 and 15. The curve may be formed by etching when manufacturing the light emitting element LD. In one or more other embodiments, the insulating layer INF may not be provided.

When the insulating layer INF is provided on the surface of the light emitting element LD, for example, on a surface of the active layer 12, the active layer 12 may be prevented from being shorted with at least one electrode (for example, at least one contact electrode among contact electrodes connected to both ends of the light emitting element LD) or the like. Accordingly, electrical stability of the light emitting element LD may be secured. In describing the embodiments, a term "connection (or access)" may comprehensively mean a physical and/or electrical connection (or access). In addition, this may comprehensively mean a direct and/or indirect connection (or access) and an integral or non-integral connection.

In addition, as the insulating layer INF is formed on the surface of the light emitting element LD, a surface defect of the light emitting element LD may be reduced or minimized, and thus life and efficiency may be improved. In addition, when the insulating layer INF is formed on each light emitting element LD, even though a plurality of light emitting elements LD are disposed dose to each other, occurrence of an unwanted short between the light emitting elements LD may be reduced or prevented.

In addition, in one or more embodiments, the light emitting element LD may be manufactured through a surface treatment process. For example, the surface treatment may be performed on each light emitting element LD so that when a plurality of light emitting elements LD are mixed in a fluid solution (or solvent) and are supplied to each emission area (for example, an emission area of each pixel), the light emitting elements LD may be uniformly dispersed in the solution without being un-uniformly aggregated.

As one or more non-limiting embodiments related to this, the insulating layer INF itself may be formed as a hydrophobic layer using a hydrophobic material, or a hydrophobic layer formed of a hydrophobic material may be additionally formed on the insulating layer INF. According to one or more embodiments, the hydrophobic material may be a material containing fluorine to exhibit hydrophobicity. In addition, according to one or more embodiments, the hydrophobic material may be applied to the light emitting elements LD in a form of a self-assembled monolayer (SAM). In this case, the hydrophobic material may include octadecyl trichlorosilane, fluoroalkyl trichlorosilane, perfluoroalkyl triethoxysilane, or the like. In addition, the hydrophobic material may be a commercially available fluorine-containing material such as Teflon™ or Cytop™, or a material corresponding thereto.

A light emitting device including the above-described light emitting element LD may be used in various types of devices requiring a light source, including a display device. For example, at least one ultra-small light emitting element LD, for example, a plurality of ultra-small light emitting elements LD each having a size of a nano scale to a micro scale, may be disposed in each pixel area of a display panel, and may configure a light source (or a light source unit) of each pixel using the ultra-small light emitting elements LD. However, in the present disclosure, an application field of the light emitting element LD is not limited to the display device. For example, the light emitting element LD may be used in other types of devices requiring a light source, such as a lighting device.

Figure 7:
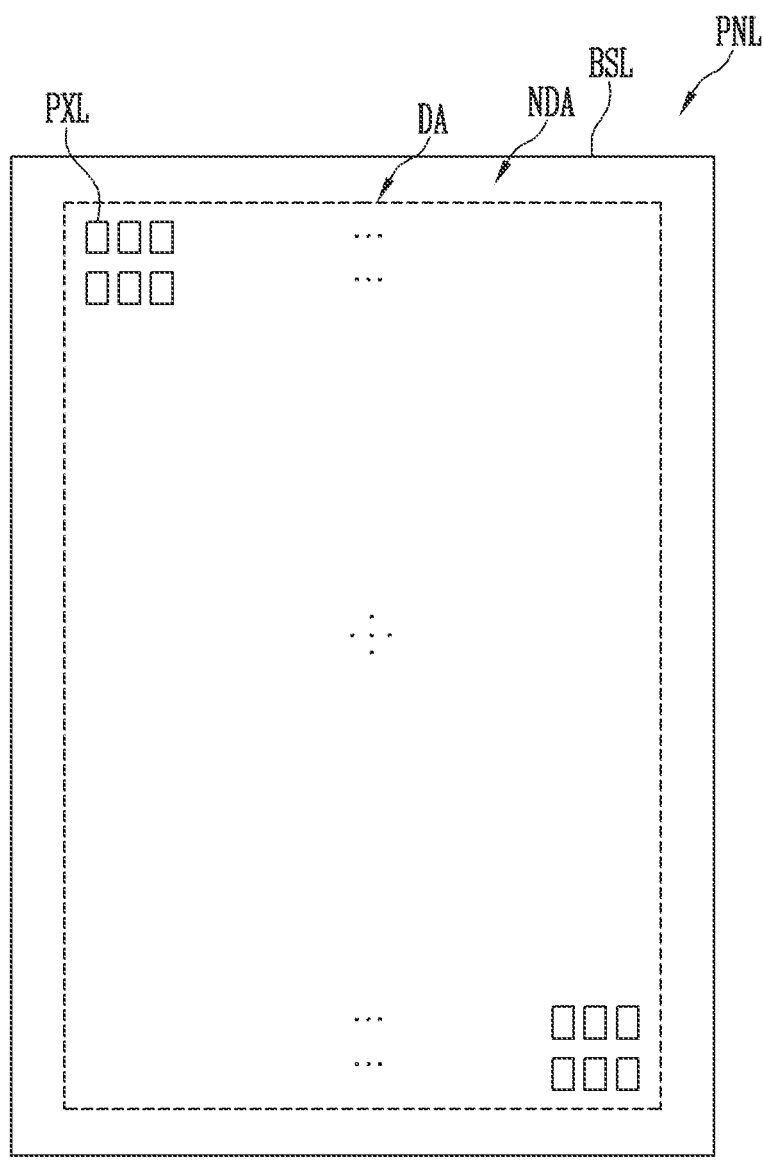
FIG. 7 is a plan view illustrating a display device according to one or more embodiments.

FIG. 7 is a plan view illustrating a display device according to one or more embodiments.

According to one or more embodiments, FIG. 7 shows a display device, for example, a display panel PNL included in the display device, as an example of a device that may use the light emitting element LD described in FIGS. 1 to 6 as a light source. For example, each of the pixels PXL of the display panel PNL may include at least one light emitting element LD.

For convenience, in FIG. 7, a structure of the display panel PNL is briefly shown based on a display area DA. However, according to one or more embodiments, at least one driving circuit unit (for example, at least one of a scan driver and a data driver) and/or a plurality of lines, may be further disposed on the display panel PNL.

Referring to FIG. 7, the display panel PNL according to one or more embodiments may include a base layer BSL and a plurality of pixels PXL disposed on the base layer BSL. For example, the display panel PNL and the base layer BSL for forming the display panel PNL may include the display area DA for displaying an image, and a non-display area NDA excluding the display area DA. In addition, the pixels PXL may be disposed in the display area DA on the base layer BSL.

According to one or more embodiments, the display area DA may be disposed in a center area of the display panel PNL, and the non-display area NDA may be disposed in an edge area of the display panel PNL to surround the display area DA. However, positions of the display area DA and the non-display area NDA are not limited thereto, and the positions of the display area DA and the non-display area NDA may be changed. The display area DA may configure a screen on which the image is displayed.

The base layer BSL may configure a base member of the display panel PNL. According to one or more embodiments, the base layer BSL may be a rigid or flexible substrate or film, and a material or a property thereof is not particularly limited. For example, the base layer BSL may be a rigid substrate formed of glass or tempered glass, a flexible substrate (or thin film) of a plastic or metal material, or at least one layer of insulating layer, and a material and/or a physical property thereof are/is not particularly limited.

In addition, the base layer BSL may be transparent, but is not limited thereto. For example, the base layer BSL may be a transparent, translucent, opaque, or reflective base member.

One area on the base layer BSL may be defined as the display area DA where the pixels PXL may be located, and a remaining area may be defined as the non-display area NDA. For example, the base layer BSL may include the display area DA including a plurality of pixel areas in which each pixel PXL is formed, and the non-display area NDA disposed outside the display area DA. Various lines, and/or built-in circuit units connected to the pixels PXL of the display area DA may be disposed in the non-display area NDA.

According to one or more embodiments, the pixels PXL may be disposed in each pixel area of the display area DA. In one or more embodiments, the pixels PXL may be arranged in the display area DA in a stripe or pentile arrangement structure, but is not limited thereto. For example, the pixels PXL may be arranged in the display area DA in various currently known arrangement structures.

Each pixel PXL may include at least one light source driven by a control signal (e.g., predetermined control signal, for example, a scan signal and a data signal) and/or power (e.g., predetermined power, for example, first power and second power). For example, each pixel PXL may include the light emitting element LD according to any one of the embodiments of FIGS. 1 to 6, for example, at least one ultra-small rod-shaped light emitting element LD having a size as small as a nano scale to a micro scale. However, in one or more embodiments, a type of the light emitting element LD that may be used as a light source of the pixel PXL is not limited thereto. For example, in one or more other embodiments, each pixel PXL may include a light emitting element of a core-shell structure manufactured by a growth method. In one or more embodiments, the light emitting element of the core-shell structure may be a light emitting element of an ultra-small core-shell structure having a size as small as a nano scale to a micro-scale, but a size of the light emitting element of the core-shell structure is not limited.

In one or more embodiments, each pixel PXL may be configured as an active pixel. However, a type, a structure, and/or a driving method of the pixels PXL that may be applied to the display device are/is not particularly limited. For example, each pixel PXL may be configured as a pixel of a passive or active light emitting display device of various currently known structures and/or driving methods.

FIGS. 8 to 11 are circuit diagrams illustrating a pixel according to one or more embodiments, respectively.

For example, FIGS. 8 to 11 show different embodiments of the pixel PXL that may be applied to an active display device. However, types of the pixel PXL and the display device to which one or more embodiments may be applied are not limited thereto. According to one or more embodiments, each pixel PXL shown in FIGS. 8 to 11 may be any one of the pixels PXL included in the display panel PNL of FIG. 7, and the pixels PXL may have structure substantially identical or similar to each other.

Figure 8:
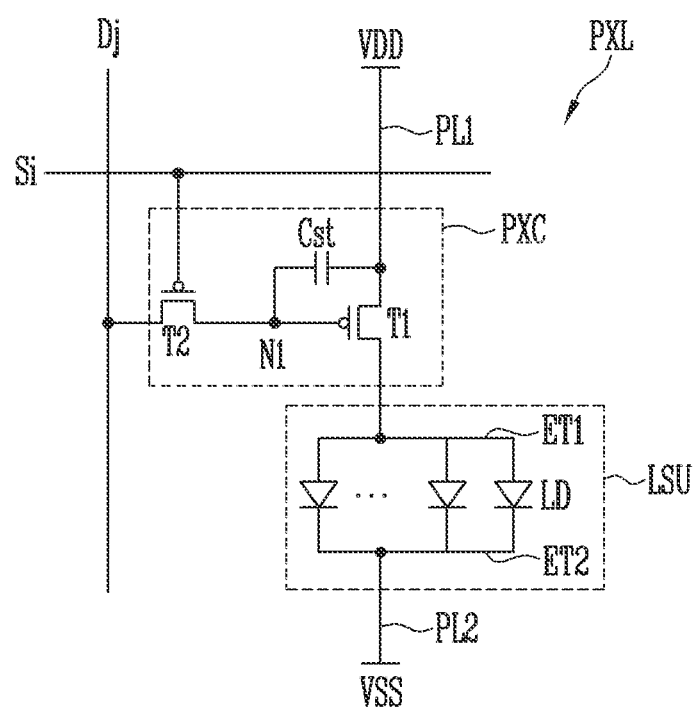
FIGS. 8 to 11 are circuit diagrams illustrating a pixel according to one or more embodiments, respectively.

Referring first to FIG. 8, the pixel PXL according to one or more embodiments includes a light source unit LSU for generating light of a luminance corresponding to a data signal. In addition, the pixel PXL may selectively further include a pixel circuit PXC for driving the light source unit LSU.

According to one or more embodiments, the light source unit LSU may include a plurality of light emitting elements LD connected between first power VDD and second power VSS. For example, the light source unit LSU may include a first electrode ET1 connected to the first power VDD via a pixel circuit PXC and a first power line PL1, a second electrode ET2 connected to the second power VSS through a second power line PL2, and a plurality of light emitting elements LD connected in parallel in the same direction between the first and second electrodes ET1 and ET2. In one or more embodiments, the first electrode ET1 may be an anode electrode, and the second electrode ET2 may be a cathode electrode.

According to one or more embodiments, each of the light emitting elements LD may include a P-type end connected to the first power VDD through the first electrode ET1, and an N-type end connected to the second power VSS through the second electrode ET2. That is, the light emitting elements LD may be connected in parallel in a forward direction between the first and second electrodes ET1 and ET2. As described above, each light emitting element LD connected in the forward direction between the first power VDD and the second power VSS may configure each effective light source, and these effective light sources may be collected to configure the light source unit LSU of the pixel PXL.

According to one or more embodiments, the first and second power VDD and VSS may have different potentials so that the light emitting elements LD emit light. For example, the first power VDD may be set as high potential power, and the second power VSS may be set as low potential power. At this time, a potential difference between the first and second power VDD and VSS may be set to be greater than or equal to a threshold voltage of the light emitting elements LD during at least emission period of the pixel PXL.

According to one or more embodiments, the P-type end of the light emitting elements LD configuring each light source unit LSU may be commonly connected to the pixel circuit PXC through one electrode (for example, the first electrode ET1 of each pixel PXL, also referred to as a "first pixel electrode" or a "first alignment electrode") of the light source unit LSU, and may be connected to the first power VDD through the pixel circuit PXC and the first power line PL1. In addition, the N-type end of the light emitting elements LD may be commonly connected to the second power VSS through another electrode (for example, the second electrode ET2 of each pixel PXL, also referred to as a "second pixel electrode" or a "second alignment electrode") of the light source unit LSU and the second power line PL2.

The light emitting elements LD of the light source unit LSU may emit light with a luminance corresponding to a driving current supplied through the corresponding pixel circuit PXC. For example, during each frame period, the pixel circuit PXC may supply a driving current corresponding to a grayscale value of corresponding frame data to the light source unit LSU. The driving current supplied to the light source unit LSU may be divided and may flow through the light emitting elements LD connected in the forward direction. Accordingly, the light source unit LSU may emit light with a luminance corresponding to the driving current while each light emitting element LD emits light with a luminance corresponding to the current flowing therethrough.

The pixel circuit PXC may be connected to a scan line Si and a data line Dj of the corresponding pixel PXL. For example, assuming that the pixel PXL is disposed in an i-th (i is a natural number) row and j-th (j is a natural number) column of the display area DA, the pixel circuit PXC of the pixel PXL may be connected to an i-th scan line Si and a j-th data line Dj of the display area DA. According to one or more embodiments, the pixel circuit PXC may include first and second transistors T1 and T2 and a storage capacitor Cst.

The first transistor T1 (also referred to as a "driving transistor") is connected between the first power VDD and the light source unit LSU. In addition, a gate electrode of the first transistor T1 is connected to a first node N1. The first transistor T1 controls the driving current supplied to the light source unit LSU in response to a voltage of the first node N1.

The second transistor T2 (also referred to as a "switching transistor") is connected between the data line Dj and the first node N1. In addition, a gate electrode of the second transistor T2 is connected to the scan line Si, The second transistor T2 is turned on when a scan signal of a gate-on voltage (for example, a low-level voltage) is supplied from the scan line Si, to electrically connect the data line Dj and the first node N1.

In each frame period, a data signal of a corresponding frame is supplied to the data line Dj, and the data signal is transmitted to the first node N1 via the second transistor T2. Accordingly, a voltage corresponding to the data signal is charged in the storage capacitor Cst.

One electrode of the storage capacitor Cst is connected to the first power VDD, and another electrode is connected to the first node N1. The storage capacitor Cst charges the voltage corresponding to the data signal supplied to the first node N1 during each frame period.

Meanwhile, in FIG. 8, all transistors included in the pixel circuit PXC, for example, the first and second transistors T1 and T2 are P-type transistors, but the present disclosure is not limited thereto. That is, at least one of the first and second transistors T1 and T2 may be changed to an N-type transistor.

Figure 9:
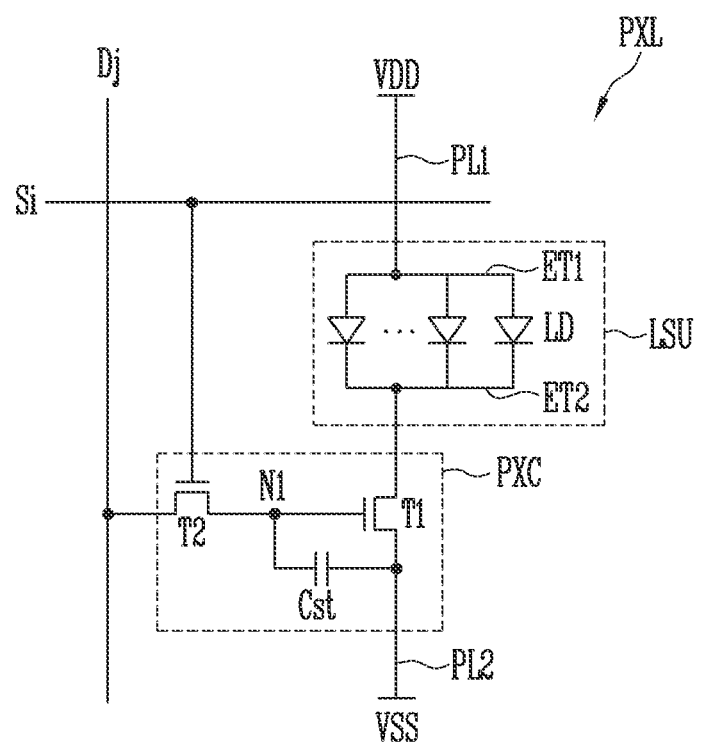

For example, as shown in FIG. 9, both of the first and second transistors T1 and T2 may be N-type transistors. In this case, the gate-on voltage of the scan signal for writing the data signal supplied to the data line Dj to the pixel PXL in each frame period may be a high-level voltage (also referred to as a "gate-high voltage"). Similarly, the voltage of the data signal for turning on the first transistor T1 may be a voltage of a level opposite to that of one or more embodiments of FIG. 8. For example, in one or more embodiments of FIG. 9, a data signal of a higher voltage may be supplied as a grayscale value, which is to be expressed, increases.

In one or more embodiments, an interconnection position of the pixel circuit PXC and the light source unit LSU may be changed. For example, as shown in FIG. 9, when all of the first and second transistors T1 and T2 configuring the pixel circuit PXC are N-type transistors, the pixel circuit PXC may be connected between the light source unit LSU and the second power VSS, and the storage capacitor Cst may be connected between the first node N1 and the second power VSS. However, the present disclosure is not limited thereto. For example, in one or more other embodiments, even though the pixel circuit PXC is configured of N-type transistors, the pixel circuit PXC may be connected between the first power VDD and the light source unit LSU, and the storage capacitor Cst may be connected between the first node N1 and the first power VDD.

A configuration and an operation of the pixel PXL shown in FIG. 9 are substantially similar to those of the pixel PXL of FIG. 8, except that a connection position of some circuit elements and a voltage level of control signals (for example, a scan signal and a data signal) are changed according to a type change of the transistor. Therefore, a detailed description of the pixel PXL of FIG. 9 is omitted.

Meanwhile, a structure of the pixel circuit PXC is not limited to the one or more embodiments corresponding to FIGS. 8 and 9. That is, the pixel circuit PXC may be configured with a pixel circuit of various currently known structures and/or driving methods. For example, the pixel circuit PXC may be configured as in one or more embodiments shown in FIG. 10.

Figure 10:
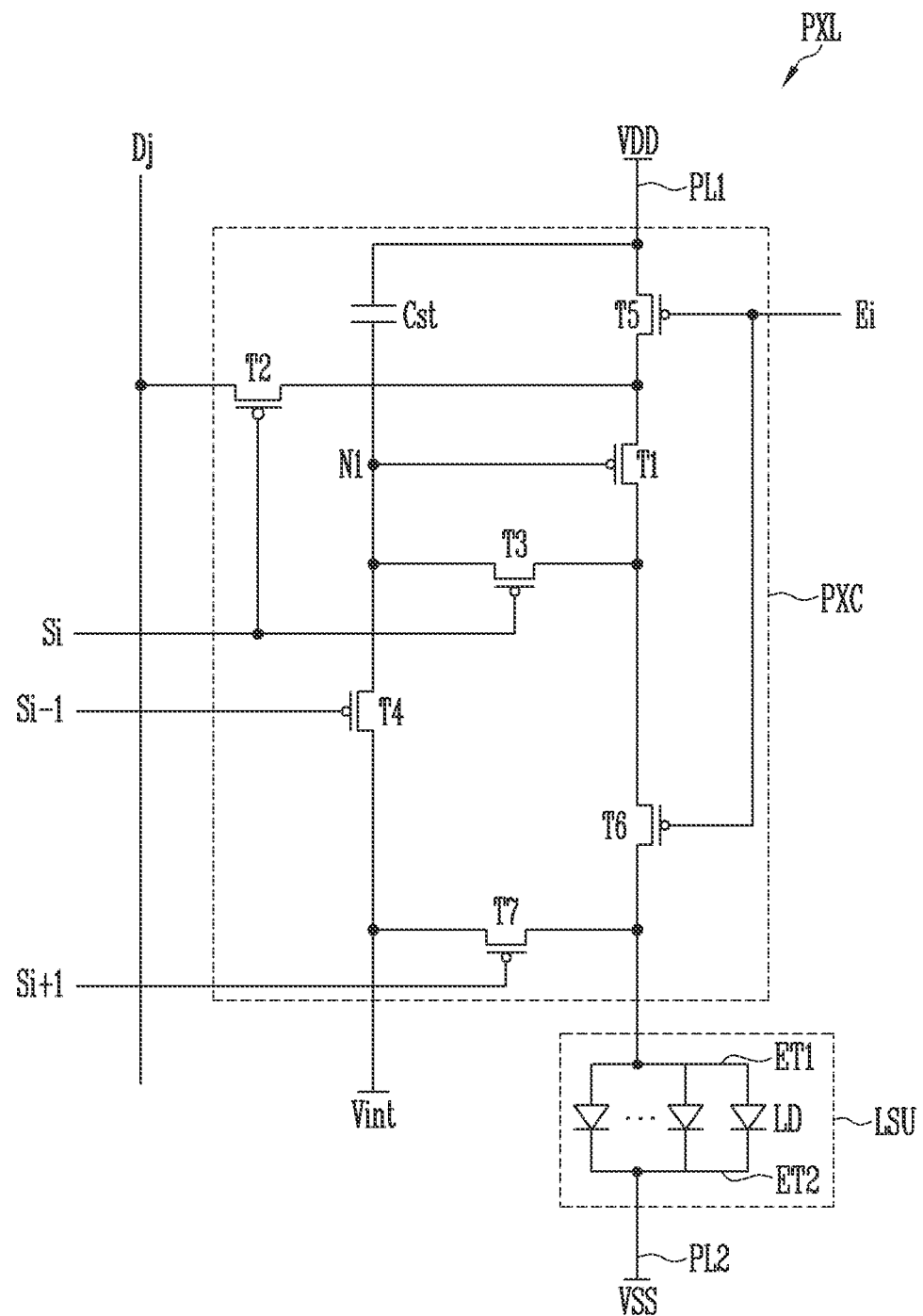

Referring to FIG. 10, the pixel circuit PXC may be further connected to at least one other scan line (or control line) in addition to the scan line Si of the corresponding horizontal line. For example, the pixel circuit PXC of the pixel PXL disposed in the i-th row of the display area DA may be further connected to an (i−1)-th scan line Si−1 and/or an (i+1)-th scan line Si+1. In addition, according to one or more embodiments, the pixel circuit PXC may be further connected to third another power in addition to the first and second power VDD and VSS. For example, the pixel circuit PXC may also be connected to an initialization power Vint. According to one or more embodiments, the pixel circuit PXC may include first to seventh transistors T1 to T7 and a storage capacitor Cst.

The first transistor T1 is connected between the first power VDD and the light source unit LSU. For example, one electrode (for example, a source electrode) of the first transistor T1 may be connected to the first power VDD through the fifth transistor T5 and the first power line PL1, and another electrode (for example, a drain electrode) of the first transistor T1 may be connected to one electrode (for example, the first pixel electrode and/or a first contact electrode of the corresponding pixel PXL) of the light source unit LSU via the sixth transistor T6. In addition, a gate electrode of the first transistor T1 is connected to a first node N1. The first transistor T1 controls the driving current supplied to the light source unit LSU in response to a voltage of the first node N1.

The second transistor T2 is connected between the data line Dj and the one electrode of the first transistor T1. In addition, a gate electrode of the second transistor T2 is connected to the corresponding scan line Si. The second transistor T2 is turned on when a scan signal of a gate-on voltage is supplied from the scan line Si, to electrically connect the data line Dj to the one electrode of the first transistor T1. Therefore, when the second transistor T2 is turned on, the data signal supplied from the data line Dj is transmitted to the first transistor T1.

The third transistor T3 is connected between the other electrode of the first transistor T1 and the first node N1. In addition, a gate electrode of the third transistor T3 is connected to the corresponding scan line Si. The third transistor T3 is turned on when the scan signal of the gate-on voltage is supplied from the scan line Si, to connect the first transistor T1 in a diode form.

The fourth transistor T4 is connected between the first node N1 and the initialization power Vint. In addition, a gate electrode of the fourth transistor T4 is connected to a previous scan line, for example, the (i−1)-th scan line Si−1. The fourth transistor T4 is turned on when the scan signal of the gate-on voltage is supplied to the (i−1)-th scan line Si−1, to transmit a voltage of the initialization power Vint to the first node N1. According to one or more embodiments, when the first transistor T1 is a P-type transistor, the voltage of the initialization power Vint for initializing a gate voltage of the first transistor T1 may be less than or equal to a lowest voltage of the data signal.

The fifth transistor T5 is connected between the first power VDD and the first transistor T1. In addition, a gate electrode of the fifth transistor T5 is connected to a corresponding emission control line, for example, an i-th emission control line Ei. The fifth transistor T5 is turned off when an emission control signal of a gate-off voltage (for example, a high-level voltage) is supplied to the emission control line Ei, and is turned on in other cases.

The sixth transistor T6 is connected between the first transistor T1 and the light source unit LSU. In addition, a gate electrode of the sixth transistor T6 is connected to the corresponding emission control line, for example, the i-th emission control line Ei. The sixth transistor T6 is turned off when the emission control signal of the gate-off voltage is supplied to the emission control line Ei, and is turned on in other cases.

The seventh transistor T7 is connected between one electrode (for example, the first pixel electrode ET1 of the corresponding pixel PXL) of the light source unit LSU and the initialization power Vint. In addition, a gate electrode of the seventh transistor T7 is connected to any one of scan lines of a next stage (a next horizontal pixel column), for example, the (i+1)-th scan line Si+1. The seventh transistor T7 is turned on when the scan signal of the gate-on voltage is supplied to the (i+1)-th scan line Si+1 to supply the voltage of the initialization power Vint to one electrode of the light source unit LSU. Accordingly, during each initialization period in which the voltage of the initialization power Vint is transmitted to the light source unit LSU, a voltage of one electrode of the light source unit LSU is initialized. Meanwhile, a control signal for controlling an operation of the seventh transistor T7 may be variously changed. For example, in one or more other embodiments, the gate electrode of the seventh transistor T7 may be connected to the scan line of the corresponding horizontal line, that is, the i-th scan line Si. In this case, the seventh transistor T7 may be turned on when the scan signal of the gate-on voltage is supplied to the i-th scan line Si, to supply the voltage of the initialization power Vint to one electrode of the light source unit LSU.

The storage capacitor Cst is connected between the first power VDD and the first node N1. The storage capacitor Cst stores a data signal supplied to the first node N1 and a voltage corresponding to a threshold voltage of the first transistor T1 in each frame period.

Meanwhile, in FIG. 10, all transistors included in the pixel circuit PXC, for example, the first to seventh transistors T1 to T7 are P-type transistors, but the present disclosure is not limited thereto. For example, at least one of the first to seventh transistors T1 to T7 may be changed to an N-type transistor.

Figure 11:
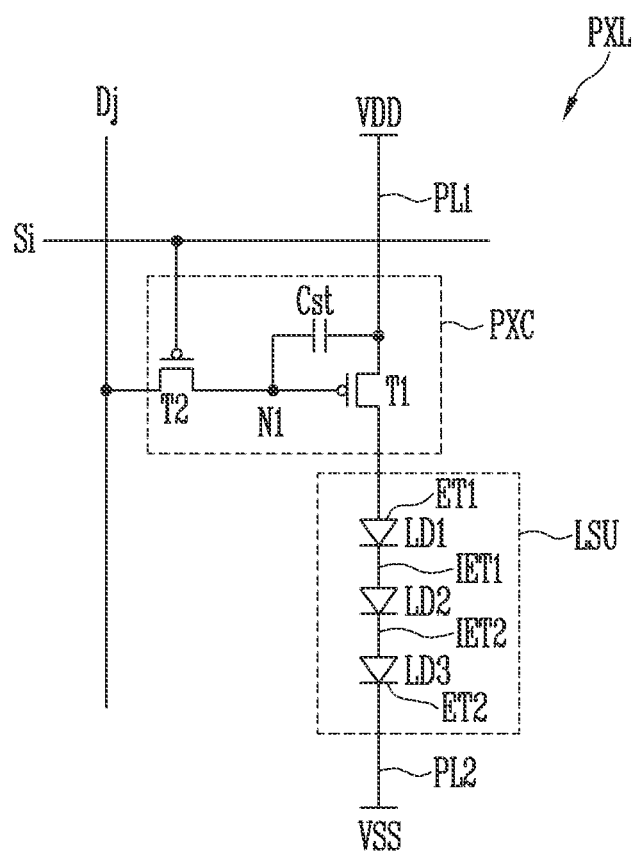

In addition, FIGS. 8 to 10 show one or more embodiments in which all effective light sources configuring each light source unit LSU, that is, the light emitting elements LD, are connected in parallel, but the present disclosure is not limited thereto. For example, in one or more other embodiments, as shown in FIG. 11, the light source unit LSU of each pixel PXL may be configured to include a series connection structure. In describing one or more embodiments of FIG. 11, a detailed description of a configuration similar or identical to that of the one or more embodiments corresponding to FIGS. 8 to 10 (for example, the pixel circuit PXC) is omitted.

Referring to FIG. 11, the light source unit LSU may include at least two light emitting elements connected to each other in series. For example, the light source unit LSU may include a first light emitting element LD1, a second light emitting element LD2, and a third light emitting element LD3 connected in series in a forward direction between the first power VDD and the second power VSS to configure each effective light source. Hereinafter, when referring to a corresponding light emitting element among the first, second, and third light emitting elements LD1, LD2, and LD3, the corresponding light emitting element is referred to as the "first light emitting element LD1", the "second light emitting element LD2", or the "third light emitting element LD3". In addition, when at least one of the first, second, and third light emitting elements LD1, LD2, and LD3 is arbitrarily referred to, or the first, second, and third light emitting elements LD1, LD2, and LD3 are generically referred to, the at least one of the first, second, and third light emitting elements LD1, LD2, and LD3 or the first, second, and third light emitting elements LD1, LD2, and LD3 may be referred to as the "light emitting element LD" or the "light emitting elements LD".

A P-type end of the first light emitting element LD1 may be connected to the first power VDD through the first electrode ET1 of the light source unit LSU, and an N-type end of the first light emitting element LD1 may be connected to a P-type end of the second light emitting element LD2 through a first intermediate electrode IET1. The P-type end of the second light emitting element LD2 may be connected to the N-type end of the first light emitting element LD1, and an N-type end of the second light emitting element LD2 may be connected to a P-type end of the third light emitting element LD3 through the second intermediate electrode IET2. The P-type end of the third light emitting element LD3 may be connected to the N-type end of the second light emitting element LD2, and an N-type end of the third light emitting element LD3 may be connected to the second power VSS through the second electrode ET2 of the light source unit LSU and the second power line PL2. In the method described method, the first, second, and third light emitting elements LD1, LD2, and LD3 may be sequentially connected in series between the first and second electrodes ET1 and ET2 of the light source unit LSU, respectively.

Meanwhile, in FIG. 11, one or more embodiments in which the light emitting elements LD are connected in a three-stage series structure is shown, but the present disclosure is not limited thereto. For example, in one or more other embodiments, two light emitting elements LD may be connected in a two-stage series structure, or four or more light emitting elements LD may be connected in a four-stage (or more) series structure.

Assuming that the same luminance is expressed using the light emitting elements LD of the same condition (for example, the same size and/or number), in the light source unit LSU of a structure in which the light emitting elements LD are connected in series, a voltage applied between the first and second electrodes ET1 and ET2 may increase, and a magnitude of the driving current flowing through the light source unit LSU may decrease as compared to the light source unit LSU of a structure in which the light emitting elements LD are connected in parallel. Therefore, when the light source unit LSU of each pixel PXL is configured by applying a series connection structure of the light emitting elements LD, a panel current flowing through the display panel PNL may be reduced as the display device is driven. Accordingly, efficiency may be improved by reducing power loss, and power consumption may be reduced. In addition, as the magnitude of the driving current to be supplied to the light source unit LSU in order to express each grayscale is reduced, the driving transistor (for example, the first transistor T1) of the pixel PXL and/or a size of an output terminal buffer (for example, an amplification circuit of each channel) of a driving circuit may be reduced.

In addition, in the light source unit LSU in which the light emitting elements LD are connected only in parallel, when a short defect occurs in at least one of the light emitting elements LD, as the driving current may flow through a defective light emitting element, the driving current may not smoothly flow through remaining light emitting elements LD. Accordingly, a dark spot defect may occur. On the other hand, in the light source unit LSU in which the light emitting elements LD are connected in a series structure of at least two stages, even though a short defect occurs in a partial series stage, as the driving current flows through the light emitting elements LD of a remaining series stage, the light emitting elements LD of the remaining series stage may emit light.

As in the above-described embodiments, the pixel PXL may include the pixel circuit PXC and/or the light source unit LSU of various structures. However, the structure of the pixel PXL applicable to the present disclosure is not limited to the embodiments shown in FIGS. 8 to 11, and each pixel PXL may have various currently known structures. For example, the pixel circuit PXC included in each pixel PXL may be configured with pixel circuits of various currently known structures and/or driving methods. In addition, in one or more other embodiments, each pixel PXL may be configured inside a passive light emitting display device or the like. In this case, the pixel circuit PXC may be omitted, and each of the first and second electrodes ET1 and ET2 of the light source unit LSU may be directly connected to the scan line Si, the data line Dj, the power line, the control line, and/or the like.

Figure 12:
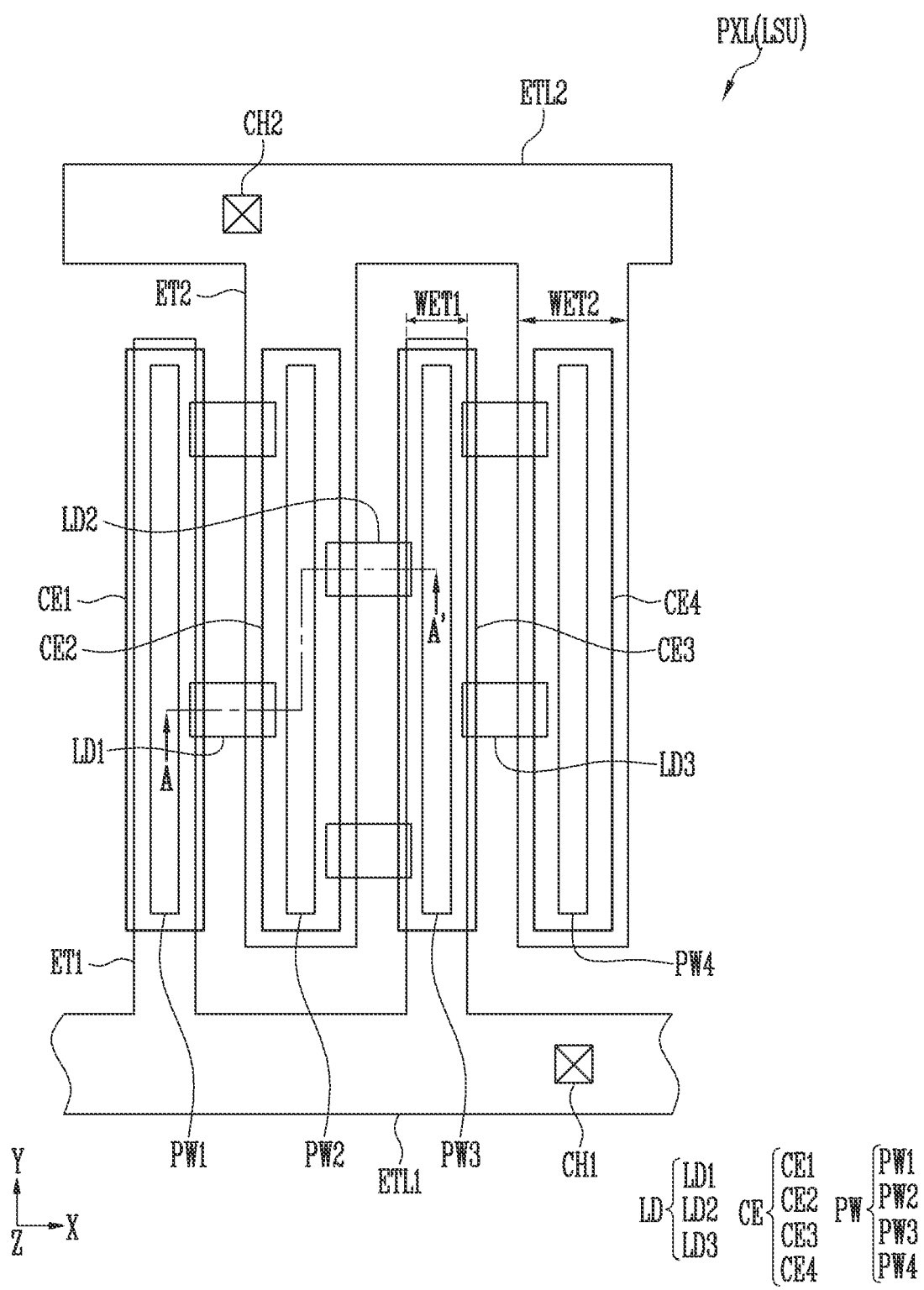
FIG. 12 is a plan view illustrating a pixel according to one or more embodiments.

FIG. 12 is a plan view illustrating a pixel according to one or more embodiments.

Each pixel PXL shown in FIG. 12 may be any one of the pixels PXL shown in FIGS. 8 to 11. In one or more embodiments, the pixels PXL disposed in the display area DA of FIG. 4 may have structures substantially identical or similar to each other.

In FIG. 12, the structure of the pixel PXL is shown based on the light source unit LSU of the pixel PXL. However, the pixel PXL may further include circuit elements configuring each pixel circuit (for example, the pixel circuit PXC of FIGS. 8 to 11). According to one or more embodiments, the circuit elements may be disposed on a layer that is different from that of the light source unit LSU. For example, the circuit elements may be disposed in a circuit element layer (or also referred to as a "pixel circuit layer") on one surface of the base layer BSL, and the light source unit LSU may be disposed in a display element layer positioned on the circuit element layer.

In addition, according to one or more embodiments, in FIG. 12, one or more embodiments in which each light source unit LSU is connected to a power line (e.g., predetermined power line, for example, first and/or second power lines PL1 and/or PL2), a circuit element (for example, at least one circuit element configuring the pixel circuit PXC) and/or a signal line (for example, the scan line Si and/or the data line Dj) through first and second contact holes CH1 and CH2 is shown, but the present disclosure is not limited thereto. For example, in one or more other embodiments, at least one of the first and second electrodes ET1 and ET2 of each pixel PXL may be directly connected to a power line (e.g., predetermined power line) and/or signal line without passing through a contact hole, an intermediate line, and/or the like.

First, referring to FIG. 12, the pixel PXL according to one or more embodiments may include the first electrode ET1 and the second electrode ET2 spaced apart from each other, and a plurality of light emitting elements LD disposed between the first and second electrodes ET1 and ET2 to be electrically connected to the first and second electrodes ET1 and ET2.

According to one or more embodiments, the first electrode ET1 and the second electrode ET2 may be spaced apart from each other and alternately arranged along the first direction (X-axis direction). In addition, each of the first electrode ET1 and the second electrode ET2 may extend in a second direction (Y-axis direction) intersecting the first direction. However, a shape, an arrangement direction, and/or a mutual disposition structure of the electrodes configuring the light source unit LSU are/is not limited thereto, and may be variously changed. For example, at least one of the first electrode ET1 and the second electrode ET2 may have a structure that is bent or curved in one area.

According to one or more embodiments, a width WET2 of the second electrode ET2 in the first direction (X-axis direction) may be greater than a width WET1 of the first electrode ET1 in the first direction (X-axis direction). Accordingly, even though the active layer 12 is not positioned at a center of the light emitting element LD due to a thickness difference (a length difference in the first direction (X-axis direction)) between the first semiconductor layer 11 and the second semiconductor layer 13, the light emitting element LD may be centrally aligned by designing the width WET1 in the first direction (X-axis direction) of the first electrode ET1 overlapping the first semiconductor layer 11 to be relatively large. A detailed description thereof is described later with reference to FIG. 15.

According to one or more embodiments, the first electrode ET1 may be electrically connected to a first electrode line ETL1 (also referred to as a "first alignment line" or a "first connection line"), and may be electrically connected to the pixel circuit PXC and/or the first power VDD through the first electrode line ETL1. According to one or more embodiments, the first electrode ET1 and the first electrode line ETL1 may be integrally or non-integrally connected. When the first electrode ET1 and the first electrode line ETL1 are integrally connected, the first electrode ET1 and the first electrode line ETL1 may be considered as different areas of one electrode, line, or pattern.

According to one or more embodiments, the second electrode ET2 may be electrically connected to a second electrode line ETL2 (also referred to as a "second alignment line" or a "second connection line"), and may be electrically connected to the second power VSS through the second electrode line ETL2. According to one or more embodiments, the second electrode ET2 and the second electrode line ETL2 may be integrally or non-integrally connected. When the second electrode ET2 and the second electrode line ETL2 are integrally connected, the second electrode ET2 and the second electrode line ETL2 may be considered as different areas of one electrode, line, or pattern.

In one or more embodiments, each of the first and second electrode lines ETL1 and ETL2 may extend along a direction crossing the first and second electrodes ET1 and ET2. For example, each of the first and second electrode lines ETL1 and ETL2 may extend in the first direction (X-axis direction) and may be disposed to be parallel to each other with electrodes of the corresponding light source unit LSU therebetween.

The first electrode line ETL1 may be connected between the first power line PL1 and the first electrode ET1. The first electrode line ETL1 may receive the first power VDD (or a first driving signal such as a scan signal, a data signal, or another control signal (e.g., predetermined another control signal)) supplied from the first power line PL1, and may transmit this to the first electrode ET1 during a period in which the display device is driven. In one or more embodiments, the first electrode line ETL1 may be electrically connected to a circuit element (e.g., predetermined circuit element, for example, at least one transistor configuring the pixel circuit PXC), a power line (for example, the first power line PL1), and/or a signal line (for example, the scan line Si, the data line Dj, or a control line (e.g., predetermined control line)). For example, the first electrode line ETL1 may be electrically connected to a circuit element (e.g., predetermined circuit element) disposed thereunder through the first contact hole CH1, and may be connected to the first power line PL1 through the circuit element. For example, each pixel PXL may further include a pixel circuit PXC connected between the first electrode line ETL1 and the first power VDD. According to one or more embodiments, the pixel circuit PXC may be disposed under each light source unit LSU and electrically connected to the first electrode line ETL1 of the light source unit LSU through the first contact hole CH1. In one or more other embodiments, the first electrode line ETL1 may be connected to a signal line to which a first driving signal (e.g., predetermined first driving signal) is supplied via the first contact hole CH1 or the like. In still one or more other embodiments, the first electrode line ETL1 may be directly connected to the first power line PL1 or to the signal line (e.g., predetermined signal line)

without passing through the first contact hole CH1 and/or the circuit element. In this case, the first electrode line ETL1 may be integrally or non-integrally connected to the first power line PL1 or the signal line (e.g., predetermined signal line).

In one or more embodiments, the first electrode line ETL1 connected to the first electrode ET1 of each of the pixels PXL may be first formed in a form commonly connected to a plurality of pixels PXL to receive a first alignment signal (e.g., predetermined first alignment signal, or first alignment voltage) in a step of aligning the light emitting elements LD.

The second electrode line ETL2 may be connected between the second power line PL2 and the second electrode ET2. The second electrode line ETL2 may receive the second power VSS (or a second driving signal such as a scan signal, a data signal, or another control signal (e.g., predetermined another control signal)), and may transmit the second power VSS to the second electrode ET2 during the period in which the display device is driven. In one or more embodiments, the second electrode line ETL2 may be electrically connected to a circuit element (e.g., predetermined circuit element, for example, at least one transistor configuring the pixel circuit PXC), a power line (for example, the second power line PL2), and/or a signal line (for example, the scan line Si, the data line Dj, or a control line (e.g., predetermined control line)). For example, the second electrode line ETL2 may be connected to the second power line PL2 disposed thereunder through the second contact hole CH2. In one or more other embodiments, the second electrode line ETL2 may be directly connected to the second power line PL2 or a signal line (e.g., predetermined signal line) without passing through the second contact hole CH2, a circuit element, and/or the like. In this case, the second electrode line ETL2 may be integrally or non-integrally connected to the second power line PL2 or the signal line (e.g., predetermined signal line).

The second electrode line ETL2 may receive a second alignment signal (e.g., predetermined second alignment signal, or second alignment voltage) in the step of aligning the light emitting elements LD. Meanwhile, during a period in which the display device is actually driven, the second electrode line ETL2 may receive the second power VSS or a second driving signal (e.g., predetermined second driving signal).

For example, the first and second electrode lines ETL1 and ETL2 may be alignment lines receiving an alignment signal (e.g., predetermined alignment signal) applied to each light source unit LSU in the step of aligning the light emitting elements LD inside each pixel PXL to manufacture the display device, and may be disposed on a path through which an alignment current corresponding to the alignment signal flows. In addition, the first and second electrode lines ETL1 and ETL2 may be connection lines receiving a driving voltage (e.g., predetermined driving voltage) applied to each light source unit LSU in a driving step of the display device (for example, in actual use), and may be disposed on a path through which the driving current of each pixel PXL flows.

The above-described first alignment signal (or first alignment voltage) and second alignment signal (or second alignment voltage) may be signals having a voltage difference and/or a phase difference at which the light emitting elements LD may be aligned. At least one of the first alignment signal (or the first alignment voltage) and the second alignment signal (or the second alignment voltage) may be an AC signal, but the present disclosure is not necessarily limited thereto.

At least one light emitting element LD may be disposed between the first electrode ET1 and the second electrode ET2 to be electrically connected to the first electrode ET1 and the second electrode ET2.

In one or more embodiments, each light emitting element LD may be an ultra-small light emitting element using a material of an inorganic crystalline structure, for example, as small as a nano scale to a micro-scale. For example, each light emitting element LD may be an ultra-small rod-shaped light emitting element having a size of a range of a nano scale to a micro scale, as shown in FIGS. 1 to 6. However, a size, a type, a shape, and the like of the light emitting elements LD may be variously changed. For example, in one or more other embodiments, each light emitting element LD may be a light emitting element of a core-shell structure manufactured by a growth method. The light emitting element of the core-shell structure may be an ultra-small light emitting element having a size of a range of a nano scale to a micro scale, but is not limited thereto.

According to one or more embodiments, the light emitting elements LD may be prepared in a dispersed form in a solution (e.g., predetermined solution), and may be supplied to each pixel area (each emission area surrounded by a bank (also referred to as a "pixel defining layer") disposed between adjacent pixels PXL) using an inkjet method or the like. In one or more embodiments, the light emitting elements LD may be supplied to each pixel area through an inkjet method, a slit-coating method, or other various methods. For example, the light emitting elements LD may be mixed with a volatile solvent and supplied to the emission area of each pixel PXL. At this time, when an alignment signal (e.g., predetermined alignment signal, or alignment voltage) is applied to the first and second electrodes ET1 and ET2, an electric field is formed between adjacent electrodes, and thus the light emitting elements LD are aligned between the electrodes by the permanent dipole of the active layer 12. After the light emitting elements LD are aligned, the solvent may be evaporated or removed by another method to stably dispose the light emitting elements LD inside each pixel PXL.

The pixel PXL may further include a plurality of bank patterns PW overlapping one area of each of the electrodes configuring the light source unit LSU. Each of the bank patterns PW may be arranged to be spaced apart from each other along the first direction (X-axis direction). In addition, each of the bank patterns PW may extend along the second direction (Y-axis direction). However, a shape, an arrangement direction, and/or a mutual arrangement structure of the bank patterns PW are/is not limited thereto, and may be variously changed. The bank patterns PW may include a first bank pattern PW1 and a third bank pattern PW3 overlapping the first electrode ET1, and a second bank pattern PW2 and a fourth bank pattern PW4 overlapping the second electrode ET2. The above-described first light emitting element LD1 may be disposed between the first bank pattern PW1 and the second bank pattern PW2, the second light emitting element LD2 may be disposed between the second bank pattern PW2 and the third bank pattern PW3, and the third light emitting element LD3 may be disposed between the third bank pattern PW3 and the fourth bank pattern PW4.

In addition, the pixel PXL may further include a plurality of contact electrodes CE overlapping one area of each of the electrodes configuring the light source unit LSU. Each of the contact electrodes CE may be arranged to be spaced apart from each other along the first direction (X-axis direction). In addition, each of the contact electrodes CE may extend along the second direction (Y-axis direction). However, a shape, an arrangement direction, and/or a mutual arrangement structure of the contact electrodes CE are/is not limited thereto, and may be variously changed. The contact electrodes CE may include a first contact electrode CE1 and a third contact electrode CE3 overlapping the first electrode ET1, and a second contact electrode CE2 and a fourth contact electrode CE4 overlapping the second electrode ET2. The first contact electrode CE1 may overlap one end of the first light emitting element LD1, the second contact electrode CE2 may overlap another end of the first light emitting element LD1 and one end of the second light emitting element LD2, the third contact electrode CE3 may overlap another end of the second light emitting element LD2 and one end of the third light emitting element LD3, and the fourth contact electrode CE4 may overlap another end of the third light emitting element LD3.

Figure 13:
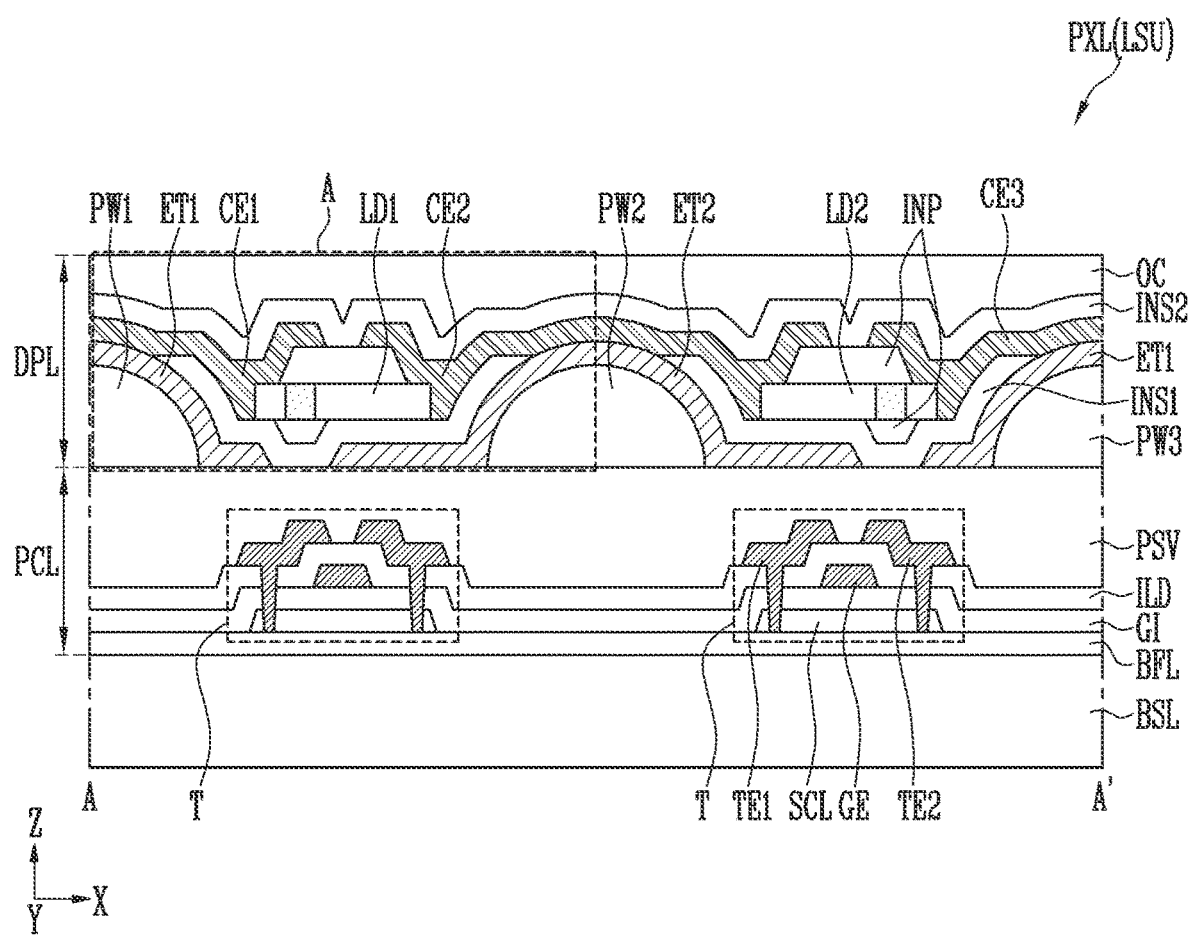
FIGS. 13 and 14 are cross-sectional views taken along the line A-A' of FIG. 12.
Figure 14:
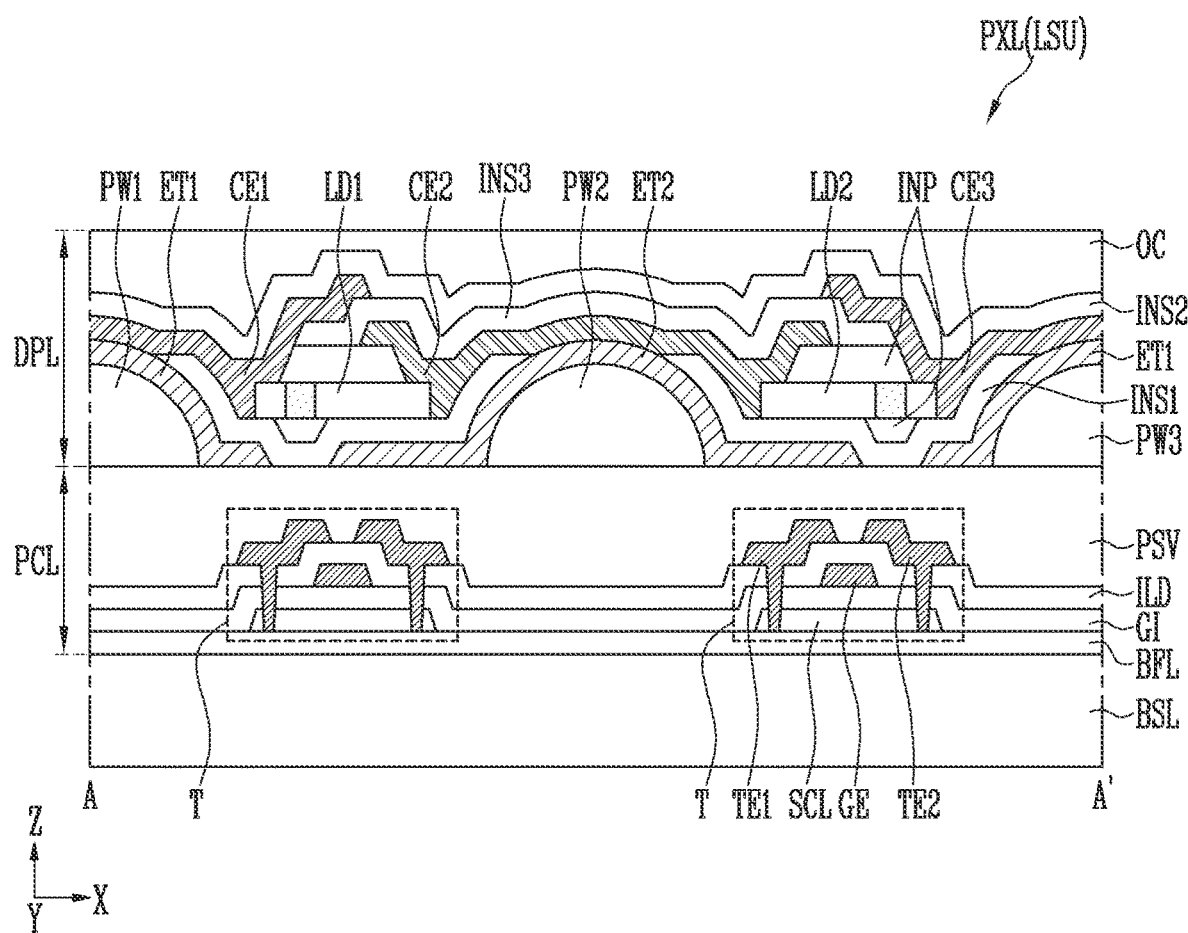
Figure 15:
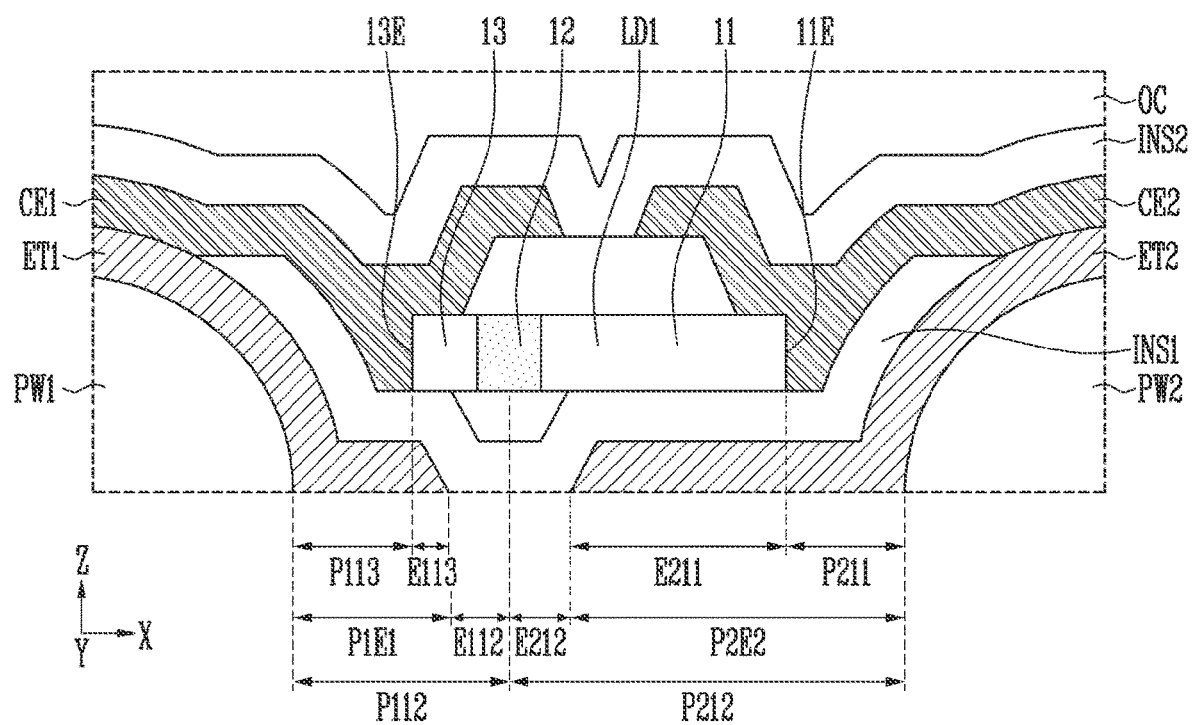
FIG. 15 is an enlarged cross-sectional view of an A area of FIG. 13.

FIGS. 13 and 14 are cross-sectional views taken along the line A-A' of FIG. 12. FIG. 15 is an enlarged cross-sectional view of an A area of FIG. 13.

FIGS. 13 and 14 illustrate different embodiments for a cross-section of the pixel PXL according to one or more embodiments.

First, referring to FIG. 13, the pixel PXL and the display device including the same according to one or more embodiments may include a circuit element layer PCL and a display element layer DPL sequentially disposed on one surface of the base layer BSL.

The circuit element layer PCL may include at least one circuit element electrically connected to the light emitting elements LD of each pixel PXL. For example, the circuit element layer PCL may include a plurality of transistors T and a storage capacitor Cst configuring each pixel circuit PXC. In addition, the circuit element layer PCL may further include at least one power line, signal line, and/or the Ike connected to each pixel circuit PXC and/or light source unit LSU.

For convenience of description, in FIG. 13, only one of any transistor T among circuit elements and lines disposed in the circuit element layer is representatively shown. However, a planar/cross-sectional structure of the circuit element layer PCL may be variously changed, and a position and a cross-sectional structure of each transistor T may be variously changed according to one or more embodiments.

In addition, the circuit element layer PCL may include a plurality of insulating layers. For example, the circuit element layer PCL may include a buffer layer BFL, a gate insulating layer GI, an interlayer insulating layer ILD, and/or a passivation layer PSV sequentially stacked on one surface of the base layer BSL. In addition, according to one or more embodiments, the circuit element layer PCL may further include at least one light blocking pattern disposed under at least one or more of the transistors T.

The buffer layer BFL may reduce or prevent an impurity from diffusing into each circuit element. The buffer layer BFL may be configured as a single layer, but may also be configured as multiple layers of at least two or more layers. When the buffer layer BFL is provided as multiple layers, each layer may be formed of the same material, or may be formed of different materials. Various circuit elements such as the transistors T and the storage capacitor Cst and various lines connected to the circuit elements may be disposed on the buffer layer BFL. Meanwhile, according to one or more embodiments, the buffer layer BFL may be omitted, and in this case, at least one circuit element and/or line may be directly disposed on one surface of the base layer BSL.

Each transistor T includes a semiconductor layer SCL (also referred to as a "semiconductor pattern" or an "active layer"), a gate electrode GE, and first and second transistor electrodes TE1 and TE2. Meanwhile, according to one or more embodiments, in FIG. 13, one or more embodiments in which each transistor T includes the first and second transistor electrodes TE1 and TE2 formed separately from the semiconductor layer SCL is shown, but the present disclosure is not limited thereto. For example, in one or more other embodiments of the present disclosure, the first and/or second transistor electrodes TE1 and/or TE2 provided in at least one transistor T may be integrated with each semiconductor layer SCL to be configured.

The semiconductor layer SCL may be disposed on the buffer layer BFL. For example, the semiconductor layer SCL may be disposed between the base layer BSL on which the buffer layer BFL is formed and the gate insulating layer GI. The semiconductor layer SCL may include a first area that is in contact with each first transistor electrode TE1, a second area that is in contact with each second transistor electrode TE2, and a channel area positioned between the first and second areas. According to one or more embodiments, one of the first and second areas may be a source area, and the other may be a drain area.

According to one or more embodiments, the semiconductor layer SCL may be a semiconductor pattern formed of polysilicon, amorphous silicon, oxide semiconductor, or the like. In addition, the channel area of the semiconductor layer SCL may be an intrinsic semiconductor pattern as a semiconductor pattern that is not doped with an impurity, and each of the first and second areas of the semiconductor layer SCL may be a semiconductor pattern doped with an impurity (e.g., predetermined impurity).

In one or more embodiments, the semiconductor layer SCL of the transistors T configuring each pixel circuit PXC may be formed of substantially the same or similar material. For example, the semiconductor layer SCL of the transistors T may be formed of the same any one material among polysilicon, amorphous silicon, and oxide semiconductor. In one or more other embodiments, a portion of the transistors T and a remaining portion of the transistors T may include the semiconductor layer SCL formed of different materials. For example, the semiconductor layer SCL of a portion of the transistors T may be formed of polysilicon or amorphous silicon, and the semiconductor layer SCL of another portion of the transistors T may be formed of an oxide semiconductor.

The gate insulating layer GI may be disposed on the semiconductor layer SCL. For example, the gate insulating layer GI may be disposed between the semiconductor layer SCL and the gate electrode GE. The gate insulating layer GI may be configured as a single layer or as multiple layers, and may include at least one inorganic insulating material and/or organic insulating material.

The gate electrode GE may be disposed on the gate insulating layer GI. For example, the gate electrode GE may be disposed to overlap the semiconductor layer SCL with the gate insulating layer GI interposed therebetween. Meanwhile, in FIG. 13, the transistor T of a top-gate structure is shown, but in one or more other embodiments, the transistor T may have a bottom-gate structure. In this case, the gate electrode GE may be disposed under the semiconductor layer SCL to overlap the semiconductor layer SCL.

The interlayer insulating layer ILD may be disposed on the gate electrode GE. For example, the interlayer insulating layer ILD may be disposed between the gate electrode GE and the first and second transistor electrodes TE1 and TE2. The interlayer insulating layer ILD may be configured as a single layer or multiple layers, and may include at least one inorganic insulating material and/or organic insulating material.

The first and second transistor electrodes TE1 and TE2 may be disposed on each semiconductor layer SCL with at least one layer of the interlayer insulating layer ILD interposed therebetween. For example, the first and second transistor electrodes TE1 and TE2 may be disposed on different ends of the semiconductor layer SCL with the gate insulating layer GI and the interlayer insulating layer ILD interposed therebetween. The first and second transistor electrodes TE1 and TE2 may be electrically connected to each semiconductor layer SCL. For example, the first and second transistor electrodes TE1 and TE2 may be connected to the first and second areas of the semiconductor layer SCL through respective contact holes passing through the gate insulating layer GI and the interlayer insulating layer ILD. According to one or more embodiments, one of the first and second transistor electrodes TE1 and TE2 may be a source electrode, and the other may be a drain electrode.

The passivation layer PSV may be disposed on the circuit elements including the transistors T and/or the lines. The passivation layer PSV may be configured as a single layer or multiple layers, and may include at least one inorganic insulating material and/or organic insulating material. For example, the passivation layer PSV may include at least one organic insulating layer and may substantially planarize a surface of the circuit element layer PCL. The display element layer DPL may be disposed on the passivation layer PSV.

The display element layer DPL may be disposed on the circuit element layer PCL.

The display element layer DPL may include the light source unit LSU of each of the pixels PXL. For example, the display element layer DPL may include a plurality of electrodes configuring the light source unit LSU of each pixel PXL and a plurality of light emitting elements LD arranged between the electrodes. For example, the display element layer DPL may include the first and second electrodes ET1 and ET2 of each pixel PXL, the first and second electrode lines ETL1 and ETL2 connected to the first and second electrodes ET1 and ET2, respectively, and the plurality of light emitting elements LD disposed between the first and second electrodes ET1 and ET2 to be electrically connected to the first and second electrodes ET1 and ET2.

In addition, the display element layer DPL may include a plurality of bank patterns PW for protruding one area of each of the electrodes in a third direction (Z-axis direction), and a plurality of contact electrodes CE for more stably connecting the light emitting elements LD between the electrodes. In addition, the display element layer DPL may further include at least one conductive layer and/or insulating layer.

The bank patterns PW may be disposed to be spaced apart from each other in the emission area of each pixel PXL. These bank patterns PW may protrude in the third direction (Z-axis direction) on one surface of the base layer BSL on which the circuit element layer PCL is formed. According to one or more embodiments, the bank patterns PW may have substantially the same height, but are not limited thereto.

According to one or more embodiments, each bank pattern PW may be disposed between a respective electrode (for example, any one of the first and second electrodes ET1 and ET2) and the circuit element layer PCL. In addition, each bank pattern PW may be disposed around at least one respective light emitting element LD to face one end or the other end of the at least one respective adjacent light emitting element LD.

According to one or more embodiments, the bank patterns PW may have various shapes. In one or more embodiments, the bank patterns PW may have a semi-circular or semi-elliptical cross-section in which a width becomes narrower toward an upper portion. In this case, each bank pattern PW may have a curved surface on at least one side surface. In addition, each electrode and/or insulating layer disposed on the bank patterns PW may have a shape corresponding to the bank patterns PW. For example, each electrode and/or insulating layer disposed on the bank patterns PW may have an inclined surface or a curved surface in an area corresponding to the bank patterns PW. However, in the present disclosure, the shape of the bank patterns PW is not particularly limited, and may be variously changed.

The bank patterns PW may include an insulating material including at least one inorganic material and/or organic material. For example, the bank patterns PW may include at least one layer of inorganic layer including various currently known inorganic insulating materials including silicon nitride (SiNx) or silicon oxide (SiOx). Alternatively, the bank patterns PW may include at least one layer of organic layer including various types of currently known organic insulating materials, a photoresist layer, and/or the like, or may be configured as an insulator of a single layer or multiple layers including organic/inorganic materials in combination. That is, in one or more embodiments, a configuration material of the bank patterns PW may be variously changed.

In one or more embodiments, the bank patterns PW may function as a reflective member. For example, the bank patterns PW may function as a reflective member that guides light emitted from each of the light emitting elements LD in a desired direction to improve light efficiency of the pixel PXL together with the first and second electrodes ET1 and ET2.

The first and second electrodes ET1 and ET2 of the light source unit LSU may be disposed on the bank patterns PW. According to one or more embodiments, the electrodes may have a shape corresponding to each bank pattern PW. For example, each electrode may protrude in the third direction (Z-axis direction) while having an inclined surface or a curved surface corresponding to each bank pattern PW.

The first and second electrodes ET1 and ET2 may include at least one conductive material. For example, the first and second electrodes ET1 and ET2 may include at least one conductive material among at least one metal among various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same, a conductive oxide such as indium tin oxide (ITO), indium zinc oxide (IZO), zinc oxide (ZnO), antimony zinc oxide (AZO), indium tin zinc oxide (ITZO), or tin oxide ($SnO_2$), and a conductive polymer such as PEDOT, but are not limited thereto.

In addition, the first and second electrodes ET1 and ET2 may be configured as a single layer or multiple layers. For example, the first and second electrodes ET1 and ET2 may include at least one layer of reflective electrode layer. In addition, the first and second electrodes ET1 and ET2 selectively further include at least one of at least one layer of transparent electrode layer disposed on and/or under the reflective electrode layer, and at least one layer of conductive capping layer covering an upper portion of the reflective electrode layer and/or the transparent electrode layer.

The first insulating layer INS1 may be disposed on one or more respective areas of the first and second electrodes ET1 and ET2. For example, the first insulating layer INS1 may be formed to cover one area of the first and second electrodes ET1 and ET2 and may include an opening to expose another area of the first and second electrodes ET1 and ET2. For example, the first insulating layer INS1 may expose one area of the first and second electrodes ET1 and ET2 on each bank pattern PW. Meanwhile, according to one or more embodiments, the first insulating layer INS1 may be omitted.

In one or more embodiments, the first insulating layer INS1 may be formed to firstly cover the first and second electrodes ET1 and ET2 entirely. After the light emitting elements LD are supplied and aligned on the first insulating layer INS1, the first insulating layer INS1 may be partially opened to expose the first and second electrodes ET1 and ET2 in one area on each bank pattern PW. Alternatively, in one or more other embodiments, the first insulating layer INS1 may be patterned in a form of an individual pattern that is locally disposed only under the light emitting elements LD after supply and alignment of the light emitting elements LD are completed. That is, the first insulating layer INS1 may be interposed between the first and second electrodes ET1 and ET2 and the light emitting elements LD, and may expose at least one area of each of the electrodes. After the electrodes are formed, the first insulating layer INS1 may be formed to cover the electrodes, thereby reducing or preventing damage to the electrodes in a subsequent process. In addition, the first insulating layer INS1 may stably support each light emitting element LD.

The first insulating layer INS1 may be configured as a single layer or multiple layers, and may include at least one inorganic insulating material and/or organic insulating material.

The plurality of light emitting elements LD may be supplied and aligned in each pixel area where the first insulating layer INS1 is formed, for example, in the emission area of each pixel PXL. For example, the plurality of light emitting elements LD may be supplied to the emission area of each pixel PXL through an inkjet method, a slit-coating method, various other methods, or the like, and the light emitting elements LD may be aligned with directionality by an alignment signal (or an alignment voltage).

For a detailed description of the alignment of the light emitting elements LD, FIG. 15 is referenced. Hereinafter, for convenience of description, bias alignment and center alignment of the light emitting elements LD are described based on the first light emitting element LD1.

Referring to FIG. 15, the alignment signal (or alignment voltage) may align the first light emitting element LD1 using the permanent dipole of the active layer 12. In this case, the active layer 12 may be disposed at a center of, or in between, one end of the first electrode ET1 and one end of the second electrode ET2. That is, a distance E112 in the first direction (X-axis direction) between the active layer 12 and the one end of the first electrode ET1 may be substantially the same as a distance E212 in the first direction (X-axis direction) between the active layer 12 and the one end of the second electrode ET2.

The first light emitting element LD1 may be aligned with directionality between the first electrode ET1 and the second electrode ET2 by the alignment signal (or alignment voltage).

According to one or more embodiments, the first light emitting element LD1 may be aligned along the first direction (X-axis direction) so that the first semiconductor layer 11 is adjacent to the second electrode ET2, and so that the second semiconductor layer 13 is adjacent to the first electrode ET1. That is, the first light emitting element LD1 may be aligned along the first direction (X-axis direction) so that one end of the first semiconductor layer 11 overlaps the second electrode ET2, and so that one end of the second semiconductor layer 13 overlaps the first electrode ET1. As described above, when the light emitting elements LD are biasedly aligned, material efficiency may be improved compared to a case where the light emitting elements LD are randomly disposed.

On the other hand, when the light emitting elements LD are biasedly aligned, as described above, center alignment of the light emitting elements LD may not be performed smoothly due to eccentricity of the active layer 12 caused by the length difference in the thickness difference (first direction (X-axis direction)) between the first semiconductor layer 11 and the second semiconductor layer 13.

Accordingly, the display device according to one or more embodiments may centrally align the light emitting elements LD without a separate center alignment signal by designing the first electrode ET1 and the second electrode ET2 asymmetrically in consideration of the eccentricity of the active layer 12.

That is, a distance E211 in the first direction (X-axis direction) between one end 11E (N-type end) of the first light emitting element LD1 and one end of the second electrode ET2 may be designed to be greater than a distance E113 in the first direction (X-axis direction) between another end 13E (a P-type end) of the first light emitting element LD1 and one end of the first electrode ET1. Accordingly, a space in which the first semiconductor layer 11 is aligned may be secured by the eccentricity of the active layer 12 within the first light emitting element LD1.

According to one or more embodiments, an area in which the first light emitting element LD1 overlaps the second electrode ET2 may be greater than an area in which the first light emitting element LD1 overlaps the first electrode ET1. In addition, an area in which the first semiconductor layer 11 overlaps the second electrode ET2 may be greater than an area in which the second semiconductor layer 13 overlaps the first electrode ET1. In addition, a distance P2E2 in the first direction (X-axis direction) between one end of the second electrode ET2 and one end of the second bank pattern PW2 may be greater than a distance P1E1 in the first direction (X-axis direction) between one end of the first electrode ET1 and one end of the first bank pattern PW1. That is, the second electrode ET2 may relatively extend from one end of the second bank pattern PW2 to secure a space in which the first semiconductor layer 11 is aligned.

According to the above-described one or more embodiments, even though the active layer 12 is not disposed at the center of the light emitting element LD due to the thickness difference (length difference in the first direction (X-axis direction)) of the first semiconductor layer 11 and the second semiconductor layer 13, the light emitting element LD may be centrally aligned between the bank patterns PW using a single alignment signal (or alignment voltage). That is, since a separate center alignment signal may be omitted, the alignment signal (or alignment voltage) may be simplified.

In addition, as the light emitting element LD is centrally aligned between the bank patterns PW, a sufficient space may be secured between one end 11E and another end 13E of the light emitting element LD and the bank patterns PW. That is, a contact area between the one end 11E and the other end 13E of the light emitting element LD and the contact electrode CE may be stably secured.

As the light emitting elements LD are centrally aligned between the bank patterns PW, a distance P211 in the first direction (X-axis direction) between one end 11E of the first light emitting element LD1 and one end of the second bank pattern PW2 may be substantially the same as a distance P113 in the first direction (X-axis direction) between another end 13E of the first light emitting element LD1 and one end of the first bank pattern PW1. In addition, a distance P112 in the first direction (X-axis direction) between the active layer 12 (e.g., a center of the active layer 12) and one end of the first bank pattern PW1 may be different from a distance P212 in the first direction (X-axis direction) between the active layer 12 (e.g., a center of the active layer 12) and one end of the second bank pattern PW2. For example, the distance P212 in the first direction (X-axis direction) between the active layer 12 and one end of the second bank pattern PW2 may be greater than the distance P112 in the first direction (X-axis direction) between the active layer 12 and one end of the first bank pattern PW1.

Referring to FIG. 13 again, an insulating pattern INP may be disposed on one area of the light emitting elements LD. For example, the insulating pattern INP may be partially disposed on only one area including a central area of each of the light emitting elements LD while exposing one end and the other end of each of the light emitting elements LD. The insulating pattern INP may be formed as an independent pattern on the emission area of each pixel PXL, but is not limited thereto. The insulating pattern INP may be omitted according to one or more embodiments.

The insulating pattern INP may be configured as a single layer or as multiple layers, and may include at least one inorganic insulating material and/or organic insulating material.

When the insulating pattern INP is formed on the light emitting elements LD after the alignment of the light emitting elements LD is completed, separation of the light emitting elements LD from an aligned position may be reduced or prevented. In addition, when a separation space exists between the first insulating layer INS1 and the light emitting elements LD, the separation space may be filled with an insulating material input in a process of forming the insulating pattern INP. Accordingly, the light emitting elements LD may be more stably supported.

One end and the other end of the light emitting elements LD that are not covered by the insulating pattern INP may be covered by the contact electrode CE. For example, one end of each of the adjacent contact electrodes CE may be disposed with the insulating pattern INP interposed therebetween and may be disposed to be spaced apart on one end and the other end of at least one adjacent light emitting element LD.

In one or more embodiments, the contact electrodes CE may be substantially simultaneously formed on the same layer on one surface of the base layer BSL as shown in FIG. 13. Accordingly, a manufacturing process of the pixel PXL and the display device including the same may be simplified.

In one or more other embodiments, the contact electrodes CE may be divided into a plurality of groups and may be sequentially formed on different layers on one surface of the base layer BSL for each group. For example, as shown in FIG. 14, a pair of adjacent contact electrodes CE may be sequentially formed on different layers on one surface of the base layer BSL. In this case, a third insulating layer INS3 may be additionally disposed between the pair of contact electrodes CE. That is, a position and a mutual disposition relationship of the contact electrodes CE may be variously changed.

In addition, the contact electrodes CE (e.g., contact electrodes CE1 and CE2) may be disposed on (e.g., respectively disposed on) the first and second electrodes ET1 and ET2 to cover an exposed area of the first and second electrodes ET1 and ET2. For example, the contact electrodes CE may be disposed on at least one area of the first and second electrodes ET1 and ET2 to be in contact with the first and second electrodes ET1 and ET2. Accordingly, the contact electrodes CE may be electrically connected to the first and second electrodes ET1 and ET2 disposed thereon, respectively, and may be electrically connected to the one end and the other end of at least one light emitting element LD disposed between the first and second electrodes ET1 and ET2 through the contact electrodes CE.

According to one or more embodiments, the contact electrodes CE may be formed of various transparent conductive materials. For example, the contact electrodes CE may include at least one of various transparent conductive materials including ITO, IZO, and ITZO, and may be implemented to be substantially transparent or translucent to satisfy a light transmittance (e.g., predetermined light transmittance). Accordingly, the light emitted from the one end and the other end of the light emitting elements LD may pass through the contact electrodes CE to be emitted to an outside of the display device.

A second insulating layer INS2 may be disposed on the contact electrodes CE. For example, the second insulating layer INS2 may be entirely formed and/or disposed on the display area DA of the base layer BSL on which the bank patterns PW, the first and second electrodes ET1 and ET2, the light emitting elements LD, the insulating pattern INP, and the contact electrodes CE are formed to cover the bank patterns PW, the first and second electrodes ET1 and ET2, the light emitting elements LD, the insulating pattern INP, and the contact electrodes CE. The second insulating layer INS2 may include at least one inorganic layer and/or organic layer.

In one or more embodiments, the second insulating layer INS2 may include a thin film encapsulation layer of a multiple layer structure, but is not limited thereto. In addition, according to one or more embodiments, at least one layer of overcoat layer OC may be further disposed on the second insulating layer INS2.

According to one or more embodiments, each of the second insulating layer INS2 and the overcoat layer OC may be configured as a single layer or multiple layers, and may include at least one inorganic insulating material and/or organic insulating material. For example, each of the second insulating layer INS2 and the overcoat layer OC may include various types of currently known organic/inorganic insulating material including silicon nitride (SiNx), silicon oxide (SiOx), or the like.

According to the above-described one or more embodiments, the light emitting elements LD may be centrally aligned using a single alignment signal (or alignment voltage) by designing the first electrode ET1 and the second electrode ET2 asymmetrically, That is, since a separate center alignment signal may be omitted, the alignment signal (or alignment voltage) may be simplified, and a contact area between the light emitting element LD and the contact electrode CE may be stably secured through the center alignment.

Figure 16:
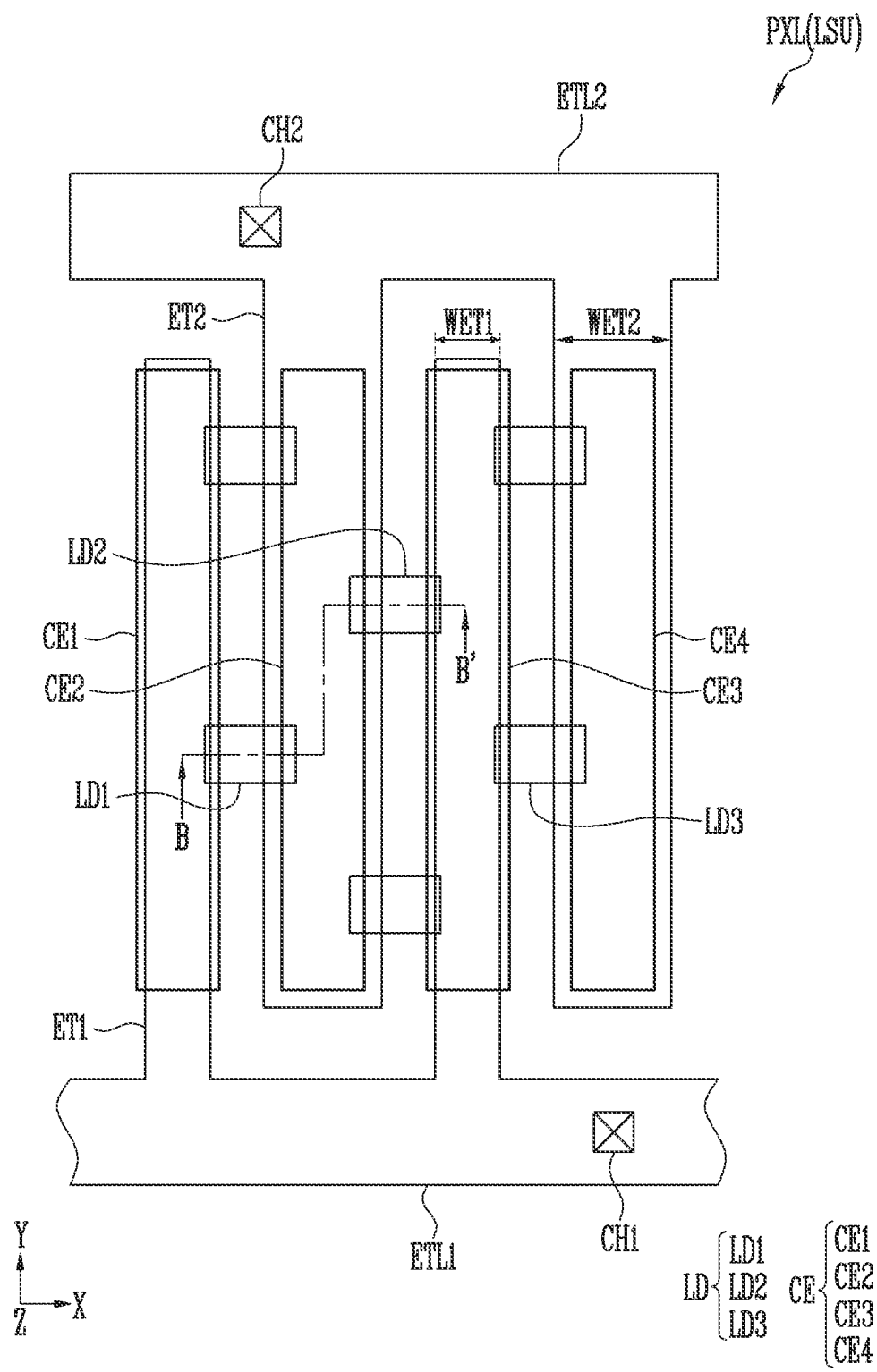
FIG. 16 is a plan view illustrating a pixel according to one or more other embodiments.
Figure 17:
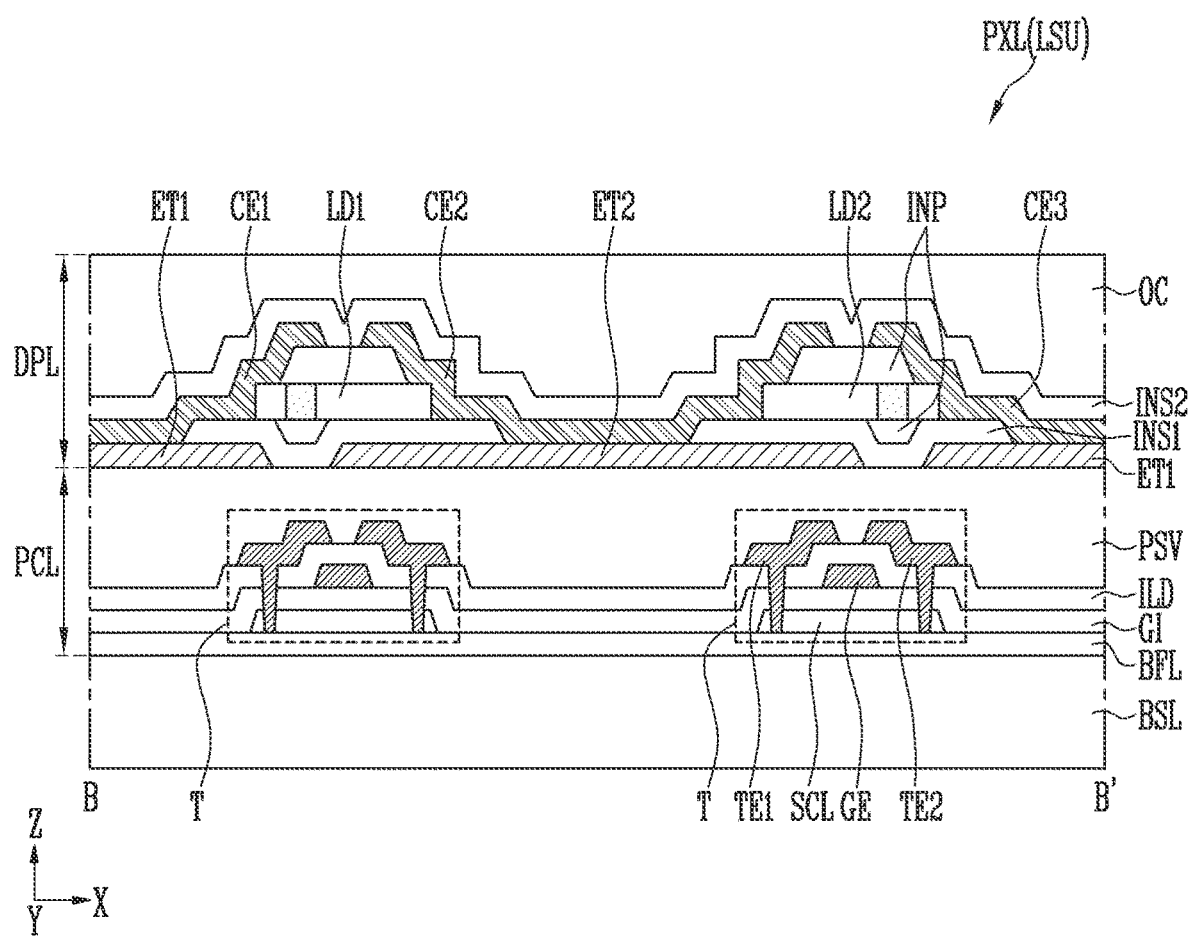
FIGS. 17 and 18 are cross-sectional views taken along the line B-B' of FIG. 16.
Figure 18:
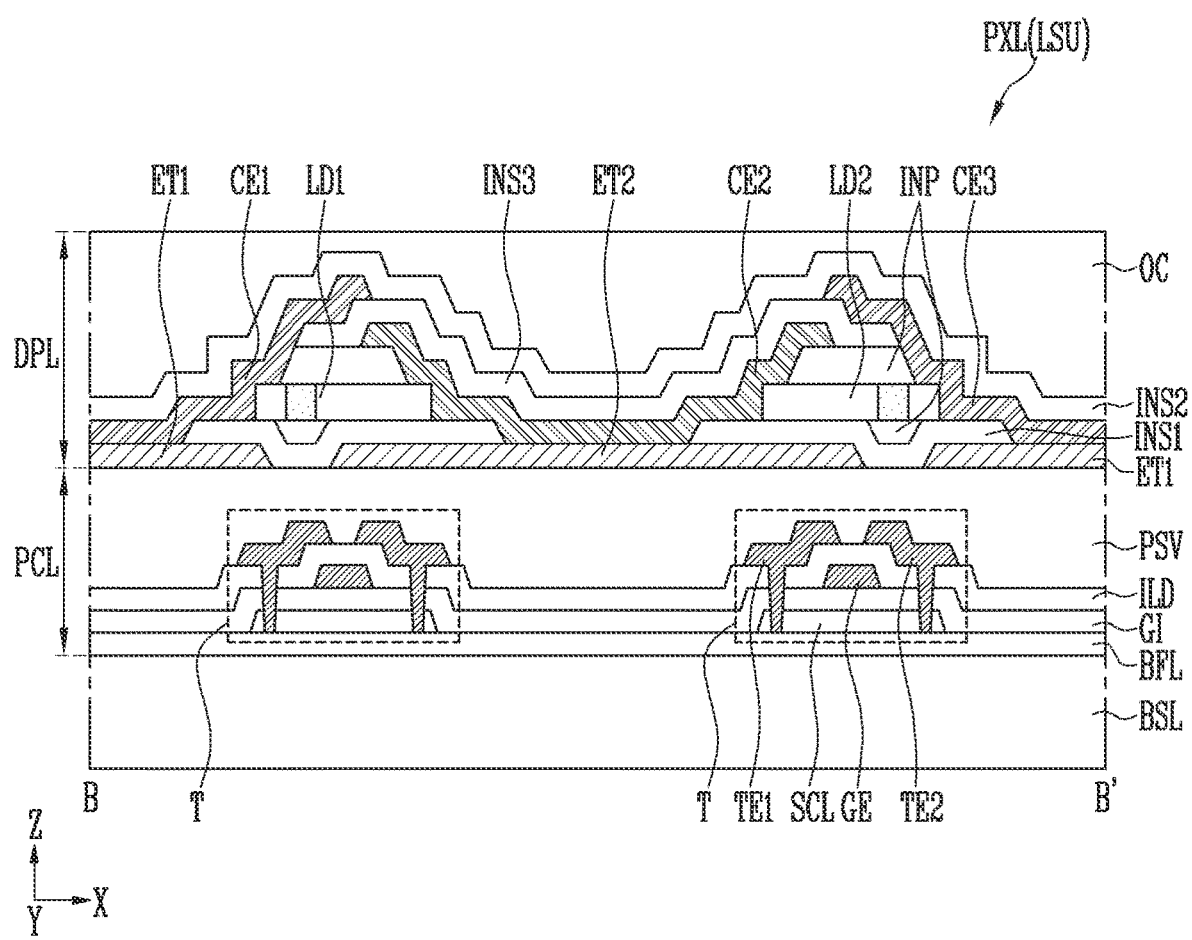

FIG. 16 is a plan view illustrating a pixel according to one or more other embodiments. FIGS. 17 and 18 are cross-sectional views taken along the line B-B' of FIG. 16.

In one or more embodiments of FIGS. 16 to 18, the same reference numerals are given to configurations similar to, or identical to, those of the above-described embodiments, and a repeated detailed description thereof is omitted.

The pixel PXL according to the present one or more embodiments is different from the one or more embodiments corresponding to FIGS. 1 to 15, in that a plurality of bank patterns are omitted.

For example, the first electrode ET1 and the second electrode ET2 may be directly disposed on one surface of an uppermost surface (for example, the passivation layer PSV) of the circuit element layer PCL. The first electrode ET1 and the second electrode ET2 may be flatly disposed along a shape of one surface of the uppermost surface (for example, the passivation layer PSV) of the circuit element layer PCL.

The light emitting elements LD may be disposed on the first electrode ET1 and the second electrode ET2, and the one end and the other end of the light emitting elements LD may be covered by the contact electrode CE. For example, respective ends of the adjacent contact electrodes CE may be disposed with the insulating pattern INP interposed therebetween, and may be respectively disposed to be spaced apart on the one end and the other end of at least one adjacent light emitting element LD.

In one or more embodiments, the contact electrodes CE may be substantially simultaneously formed on the same layer on one surface of the base layer BSL as shown in FIG. 17. Accordingly, the manufacturing process of the pixel PXL and the display device including the same may be simplified.

In one or more other embodiments, the contact electrodes CE may be divided into a plurality of groups and may be sequentially formed on different layers on one surface of the base layer BSL for each group. For example, as shown in FIG. 14, a pair of adjacent contact electrodes CE may be sequentially formed on different layers on one surface of the base layer BSL. In this case, a third insulating layer INS3 may be additionally disposed between the pair of contact electrodes CE. That is, a position and a mutual disposition relationship of the contact electrodes CE may be variously changed.

In addition, the contact electrodes CE may cover one surface of the first electrode ET1 and the second electrode ET2 exposed by the first insulating layer INS1. Accordingly, the one end of the light emitting elements LD may be electrically connected to the first electrode ET1 by the first contact electrode CE1, and the other end of the light emitting elements LD may be electrically connected to the second electrode ET2 by the second contact electrode CE2.

According to the present one or more embodiments, since the plurality of bank patterns in the pixel PXL may be omitted, an element density in the pixel PXL may be improved.

Since other configurations are described with reference to FIGS. 1 to 15, an overlapping content is omitted.

Figure 19:
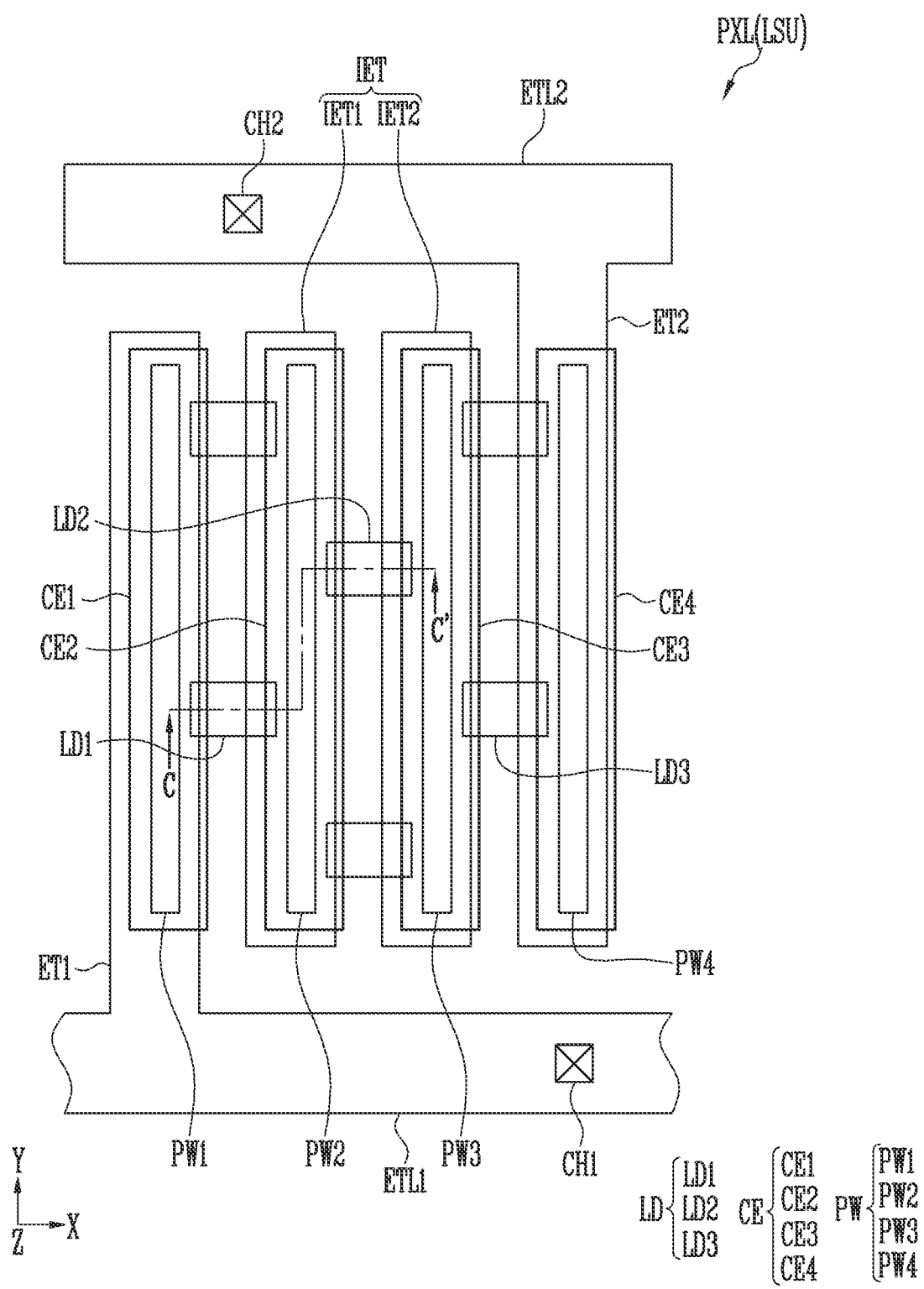
FIG. 19 is a plan view illustrating a pixel according to still one or more other embodiments.
Figure 20:
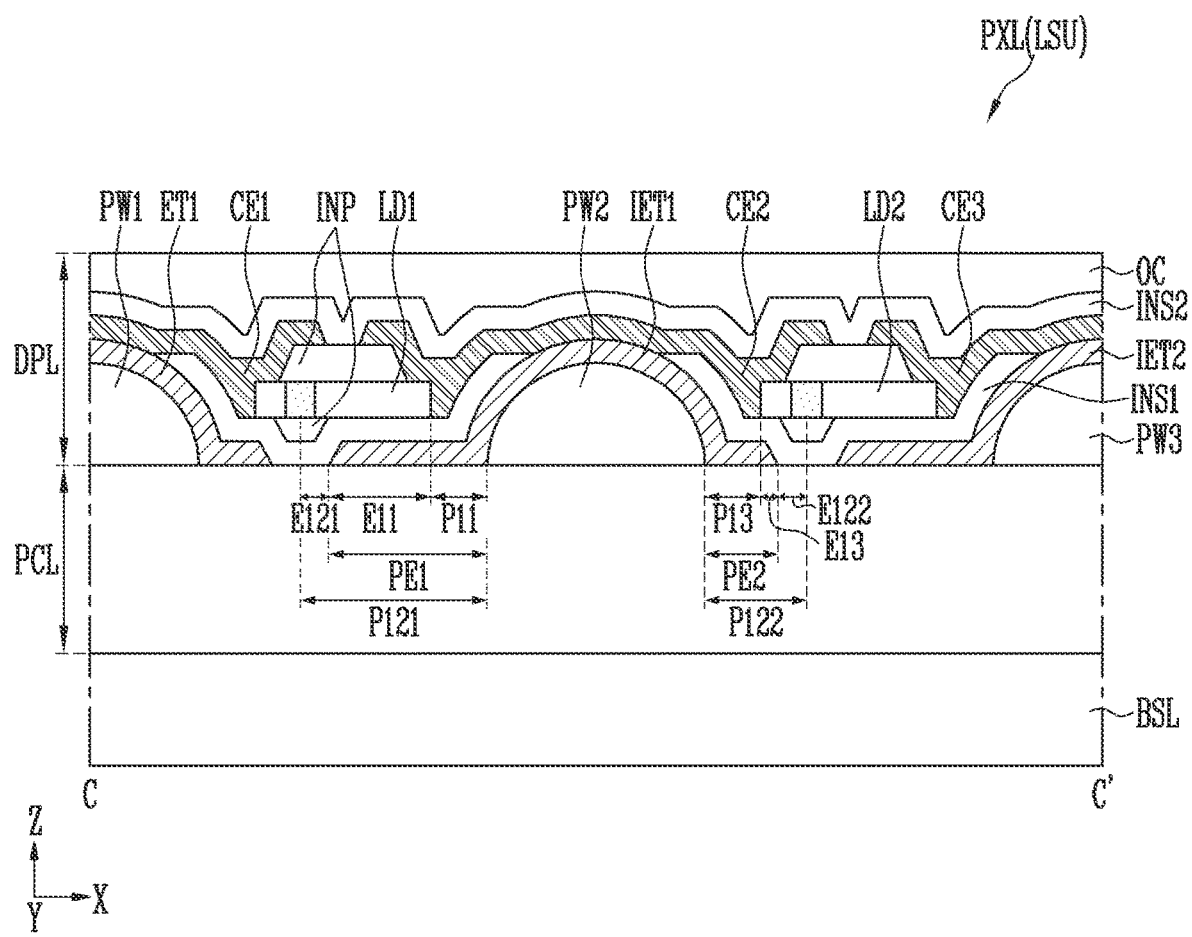
FIGS. 20 and 21 are cross-sectional views taken along the line C-C' of FIG. 19.
Figure 21:
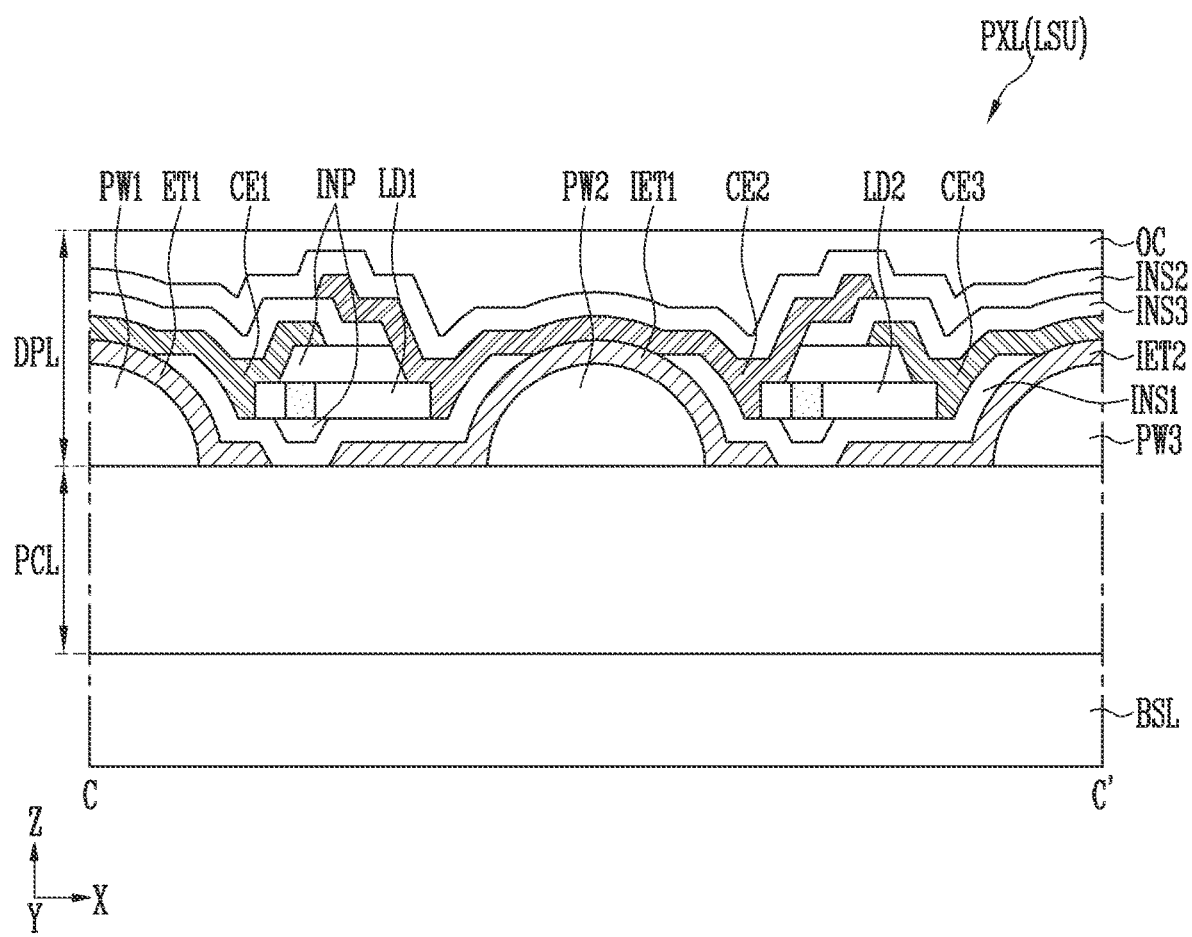

FIG. 19 is a plan view illustrating a pixel according to still one or more other embodiments. FIGS. 20 and 21 are cross-sectional views taken along the line C-C' of FIG. 19.

In one or more embodiments of FIGS. 19 to 21, the same reference numerals are given to configurations similar to or identical to those of the above-described embodiments, and a repeated detailed description thereof is omitted.

The pixel PXL according to the present one or more embodiments is different from the one or more embodiments corresponding to FIGS. 1 to 15, in that the pixel PXL according to the present one or more embodiments further includes at least one intermediate electrode IET disposed between the first and second electrodes ET1 and ET2, and the light emitting elements LD are connected in series.

For example, referring to FIG. 19, the pixel PXL may include the first electrode ET1 and the second electrode ET2 spaced apart from each other, at least one intermediate electrode IET disposed between the first and second electrodes ET1 and ET2, and a plurality of light emitting elements LD connected between a pair of adjacent electrodes among the first and second electrodes ET1 and ET2 and the at least one intermediate electrode SET.

The first electrode ET1, the at least one intermediate electrode IET, and the second electrode ET2 may be sequentially connected in series via each light emitting element LD to configure electrodes of each series stage.

The first electrode ET1, a first intermediate electrode IET1, a second intermediate electrode IET2, and the second electrode ET2 may be spaced apart from each other and sequentially arranged along the first direction (X-axis direction). The first electrode ET1 and the first intermediate electrode IET1 adjacent to each other may form a pair to configure electrodes of the first series stage. Similarly, the first intermediate electrode IET1 and the second intermediate electrode IET2 adjacent to each other may form a pair to configure electrodes of a second series stage, and the second intermediate electrode IET2 and the second electrode ET2 adjacent to each other may form a pair to configure electrodes of a third series stage.

Each of the first electrode ET1, the first intermediate electrode IET1, the second intermediate electrode IET2, and the second electrode ET2 may extend along the second direction (the Y-axis direction). For example, each of the first electrode ET1, the first intermediate electrode SET1, the second intermediate electrode IET2, and the second electrode ET2 may be disposed side by side with each other while having a bar shape extending along the second direction (Y-axis direction). However, a shape, an arrangement direction, and/or a mutual disposition structure of the electrodes configuring the light source unit LSU are/is not limited thereto, and may be variously changed. For example, a pair of electrodes configuring each series stage of the light source unit LSU may be disposed to be spaced apart from each other in a double helical structure or the like. In addition, at least one of the first electrode ET1, the first intermediate electrode IET1, the second intermediate electrode IET2, and the second electrode ET2 may have a structure that is bent or curved in one area According to one or more embodiments, the first electrode ET1 may be electrically connected to the first electrode line ETL1, and may be electrically connected to the pixel circuit PXC and/or the first power VDD through the first electrode line ETL1. The second electrode ET2 may be electrically connected to the second electrode line ETL2, and may be electrically connected to the second power VSS through the second electrode line ETL2.

In one or more embodiments, each of the first and second electrode lines ETL1 and ETL2 may extend along a direction crossing the first and second electrodes ET1 and ET2. For example, each of the first and second electrode lines ETL1 and ETL2 may extend along the first direction (X-axis direction) and may be disposed to be parallel to each other with electrodes of the corresponding light source unit LSU interposed therebetween.

The first electrode line ETL1 may be connected between the first power line PL1 and the first electrode ET1. The first electrode line ETL1 may receive the first power VDD (or a first driving signal such as a scan signal, a data signal, or another control signal (e.g., predetermined another control signal)) supplied from the first power line PL1, and may transmit this to the first electrode ET1 during a period in which the display device is driven. In one or more embodiments, the first electrode line ETL1 may be electrically connected to a circuit element (e.g., predetermined circuit element, for example, at least one transistor configuring the pixel circuit PXC), a power line (for example, the first power line PL1), and/or a signal line (for example, the scan line Si, the data line Dj, or a control line (e.g., predetermined control line)). For example, the first electrode line ETL1 may be electrically connected to a circuit element (e.g., predetermined circuit element) disposed thereunder through the first contact hole CH1, and may be connected to the first power line PL1 through the circuit element. For example, each pixel PXL may further include a pixel circuit PXC connected between the first electrode line ETL1 and the first power VDD. According to one or more embodiments, the pixel circuit PXC may be disposed under each light source unit LSU and may be electrically connected to the first electrode line ETL1 of the light source unit LSU through the first contact hole CH1. In one or more other embodiments, the first electrode line ETL1 may be connected to a signal line to which a first driving signal (e.g., predetermined first driving signal) is supplied via the first contact hole CH1 or the like. In still one or more other embodiments, the first electrode line ETL1 may be directly connected to the first power line PL1 or the signal line (e.g., predetermined signal line) without passing through the first contact hole CH1 and/or the circuit element. In this case, the first electrode line ETL1 may be integrally or non-integrally connected to the first power line PL1 or the signal line (e.g., predetermined signal line).

In one or more embodiments, the first electrode line ETL1 connected to the first electrode ET1 of each of the pixels PXL may be first formed in a form commonly connected to a plurality of pixels PXL to receive a first alignment signal (e.g., predetermined first alignment signal, or first alignment voltage) in a step of aligning the light emitting elements LD. Thereafter, by disconnecting the first electrode line ETL1 between the pixels PXL, the pixels PXL may be manufactured in a form capable of being individually driven. For example, the first electrode lines ETL1 of adjacent pixels PXL may be separated.

The second electrode line ETL2 may be connected between the second power line PL2 and the second electrode ET2. The second electrode line ETL2 may receive the second power VSS (or a second driving signal such as a scan signal, a data signal, or another control signal (e.g., predetermined another control signal)), and may transmit this to the second electrode ET2 during the period in which the display device is driven. In one or more embodiments, the second electrode line ETL2 may be electrically connected to a circuit element (e.g., predetermined circuit element, for example, at least one transistor configuring the pixel circuit PXC), a power line (for example, the second power line PL2), and/or a signal line (for example, the scan line Si, the data line Dj, or a control line (e.g., predetermined control line)). For example, the second electrode line ETL2 may be connected to the second power line PL2 disposed thereunder through the second contact hole CH2. In one or more other embodiments, the second electrode line ETL2 may be directly connected to the second power line PL2 or a signal line (e.g., predetermined signal line) without passing through the second contact hole CH2, a circuit element, and/or the like. In this case, the second electrode line ETL2 may be integrally or non-integrally connected to the second power line PL2 or the signal line (e.g., predetermined signal line).

The second electrode line ETL2 may receive a second alignment signal (e.g., predetermined second alignment signal, or second alignment voltage) in the step of aligning the light emitting elements LD. Meanwhile, during a period in which the display device is actually driven, the second electrode line ETL2 may receive the second power VSS or a second driving signal (e.g., predetermined second driving signal).

For example, the first and second electrode lines ETL1 and ETL2 may be alignment lines receiving an alignment signal (e.g., predetermined alignment signal) applied to each light source unit LSU in the step of aligning the light emitting elements LD inside each pixel PXL to manufacture the display device and may be disposed on a path through which an alignment current corresponding to the alignment signal flows. In addition, the first and second electrode lines ETL1 and ETL2 may be connection lines receiving a driving voltage (e.g., predetermined driving voltage) applied to each light source unit LSU in a driving step of the display device (for example, in actual use) and may be disposed on a path through which the driving current of each pixel PXL flows.

According to one or more embodiments, each intermediate electrode IET, for example, the first and second intermediate electrodes IET1 and IET2 may be first formed in a form connected to the first or second electrode line ETL1 or ETL2 to receive the first or second alignment signal (e.g., predetermined first or second alignment signal) in the step of aligning the light emitting elements LD. In addition, after the alignment of the light emitting elements LD is completed, the first, second, and third light emitting elements LD1, LD2, and LD3 may be connected in series by separating each intermediate electrode IET from the first or second electrode line ETL1 or ETL2.

At least one light emitting element LD may be connected in a forward direction between a pair of adjacent electrodes. For example, at least one first light emitting element LD1 may be connected in the forward direction between the first electrode ET1 and the first intermediate electrode IET1, at least one second light emitting element LD2 may be connected in the forward direction between the first intermediate electrode IET1 and the second intermediate electrode IET2, and at least one third light emitting element LD3 may be connected in the forward direction between the second intermediate electrode IET2 and the second electrode ET2.

The pixel PXL may further include a plurality of bank patterns PW disposed under one area of each of the electrodes configuring the light source unit LSU, and/or a plurality of contact electrodes CE disposed on each of the electrodes. For example, the pixels PXL may include first to fourth bank patterns PW1, PW2, PW3, and PW4 disposed under the first electrode ET1, the first intermediate electrode IET1, the second intermediate electrode IET2, and the second electrode ET2, respectively. In addition, the pixel PXL may include first to fourth contact electrodes CE1, CE2, CE3, and CE4 disposed on the first electrode ET1, the first intermediate electrode IET1, the second intermediate electrode IET2, and the second electrode ET2, respectively.

Hereinafter, a detailed structure of the circuit element layer PCL is omitted for convenience of description, and a cross-sectional structure of the pixel PXL is described based on the first light emitting element LD1 and the second light emitting element LD2.

Referring to FIG. 20, the first light emitting element LD1 may be disposed between the first electrode ET1 and the first intermediate electrode IET1, and the second light emitting element LD2 may be disposed between the first intermediate electrode IET1 and the second intermediate electrodes IET2.

The first light emitting element LD1 and the second light emitting element LD2 may be aligned between the electrodes by the alignment signal (or alignment voltage) using the permanent dipole of the active layer 12.

In this case, a distance E121 in the first direction (X-axis direction) between the active layer 12 (e.g., the center of the active layer 12) of the first light emitting element LD1 and one end of the first intermediate electrode IET1 may be substantially the same as a distance E122 in the first direction (X-axis direction) between the active layer 12 (e.g., the center of the active layer 12) of the second light emitting element LD2 and another end of the first intermediate electrode IET1.

The first light emitting element LD1 and the second light emitting element LD2 may be aligned with directionality between electrodes by the alignment signal (or the alignment voltage). A direction in which the first light emitting element LD1 and the second light emitting element LD2 are arranged may be the same, but is not necessarily limited thereto. For example, each of the first light emitting element LD1 and the second light emitting element LD2 may be aligned so that the first semiconductor layer 11 faces the first direction (X-axis direction) and the second semiconductor layer 13 faces a direction opposite to the first direction (X-axis direction). That is, the first light emitting element LD1 may be aligned along the first direction (X-axis direction) so that the first semiconductor layer 11 is adjacent to the first intermediate electrode IET1 and the second semiconductor layer 13 is adjacent to the first electrode ET1. The second light emitting element LD2 may be aligned along the first direction (X-axis direction) so that the first semiconductor layer 11 is adjacent to the second intermediate electrode IET2 and the second semiconductor layer 13 is adjacent to the first intermediate electrode IET1.

According to one or more embodiments, the first intermediate electrode IET1 may overlap the first semiconductor layer 11 of the first light emitting element LD1 and may overlap the second semiconductor layer 13 of the second light emitting element LD2. As described above, when the light emitting elements LD are biasedly aligned, the material efficiency may be improved compared to the case where the light emitting elements LD are randomly arranged as described above.

On the other hand, when the light emitting elements LD are biasedly aligned, as described above, center alignment of the light emitting elements LD may not be performed smoothly due to eccentricity of the active layer 12 caused by the length difference in the thickness difference (first direction (X-axis direction)) between the first semiconductor layer 11 and the second semiconductor layer 13.

Accordingly, the display device according to one or more embodiments may centrally align the light emitting elements LD without a separate center alignment signal by designing the first intermediate electrode IET1 asymmetrically in consideration of the eccentricity of the active layer 12.

That is, an area in which the first intermediate electrode IET1 and the first semiconductor layer 11 of the first light emitting element LD1 overlap may be designed to be greater than an area in which the first intermediate electrode IET1 and the second semiconductor layer 13 of the second light emitting element LD2 overlap. Accordingly, a space in which the first semiconductor layer 11 is aligned may be secured by the eccentricity of the active layer 12 within the light emitting elements LD1 and LD2.

According to one or more embodiments, a distance E11 in the first direction (X-axis direction) between one end of the first intermediate electrode IET1 and the one end of the first semiconductor layer 11 of the first light emitting element LD1 may be greater than a distance E13 in the first direction (X-axis direction) between the other end of the first intermediate electrode IET1 and one end of the second semiconductor layer 13 of the second light emitting element LD2. In addition, a distance PE1 in the first direction (X-axis direction) between one end of the first intermediate electrode IET1 and one end of the second bank pattern PW2 may be greater than a distance PE2 in the first direction (X-axis direction) between the other end of the first intermediate electrode IET1 and another end of the second bank pattern PW2.

According to the present one or more embodiments, even though the active layer 12 is not disposed at the center of the light emitting element LD due to the thickness difference (length difference in the first direction (X-axis direction)) of the first semiconductor layer 11 and the second semiconductor layer 13, the light emitting element LD may be centrally aligned between the bank patterns PW using a single alignment signal (or alignment voltage). That is, since a separate center alignment signal may be omitted, the alignment signal (or alignment voltage) may be simplified as described above.

In addition, as the light emitting element LD is centrally aligned between the bank patterns PW, a sufficient space may be secured between the one end and the other end of the light emitting element LD and the bank patterns PW. That is, a contact area between the one end and the other end of the light emitting element LD and the contact electrode CE may be stably secured.

According to one or more embodiments, a distance P11 in the first direction (X-axis direction) between the one end of the first semiconductor layer 11 of the first light emitting element LD and one end of the second bank pattern PW2 may be substantially the same as a distance P13 in the first direction (X-axis direction) between the one end of the second semiconductor layer 13 of the second light emitting element LD2 and the other end of the second bank pattern PW2. In addition, a distance P121 in the first direction (X-axis direction) between the active layer 12 (e.g., a center of the active layer 12) of the first light emitting element LD1 and the one end of the second bank pattern PW2 may be different from a distance P122 in the first direction (X-axis direction) between the active layer 12 (e.g., a center of the active layer 12) of the second light emitting element LD2 and the other end of the second bank pattern PW2. For example, the distance P121 in the first direction (X-axis direction) between the active layer 12 of the first light emitting element LD1 and the one end of the second bank pattern PW2 may be greater than the distance P122 in the first direction (X-axis direction) between the active layer 12 of the second light emitting element LD2 and the other end of the second bank pattern PW2.

Since other configurations are described with reference to FIGS. 1 to 15, an overlapping content is omitted.

Figure 22:
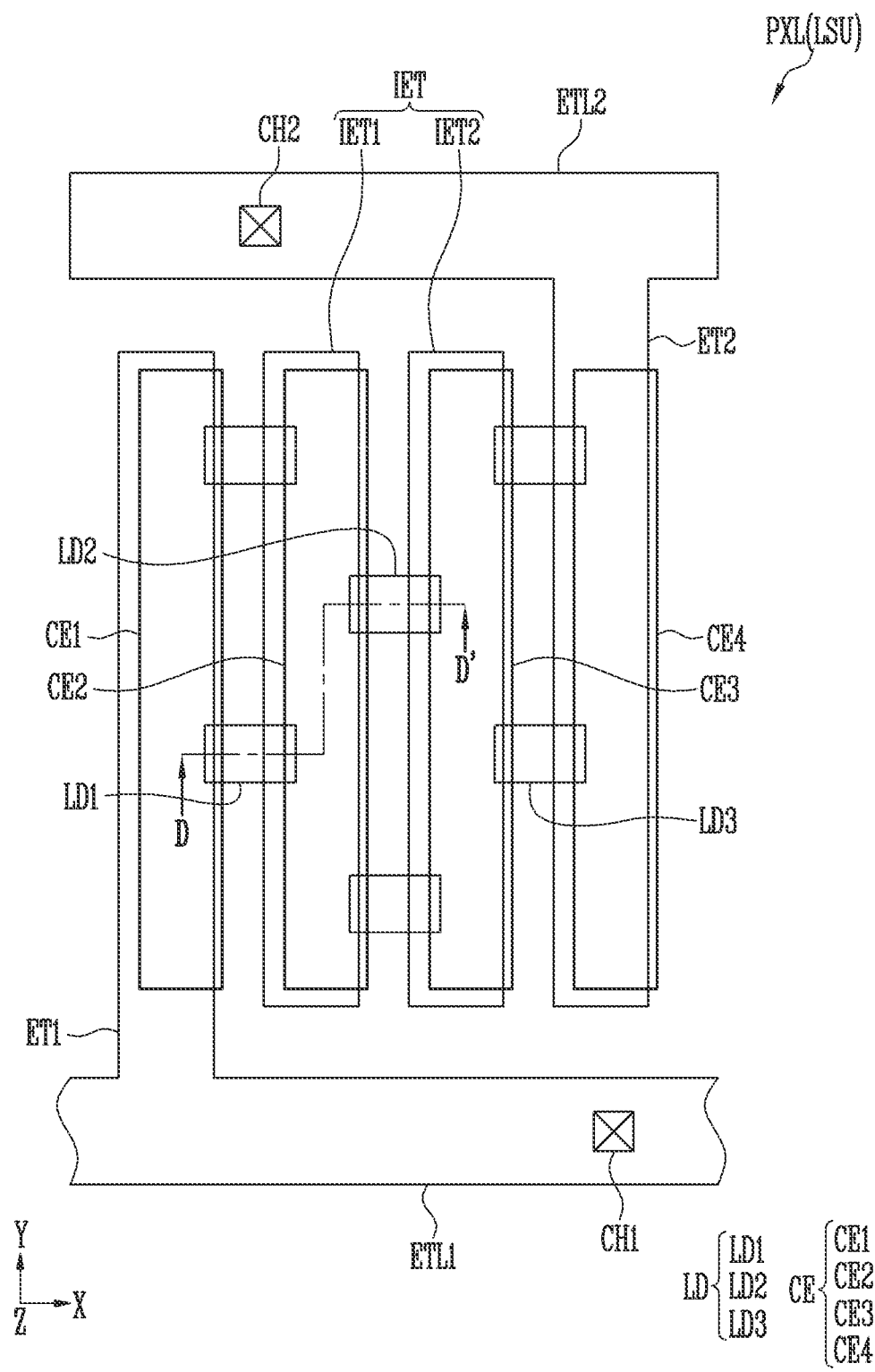
FIG. 22 is a plan view illustrating a pixel according to one or more other embodiments.
Figure 23:
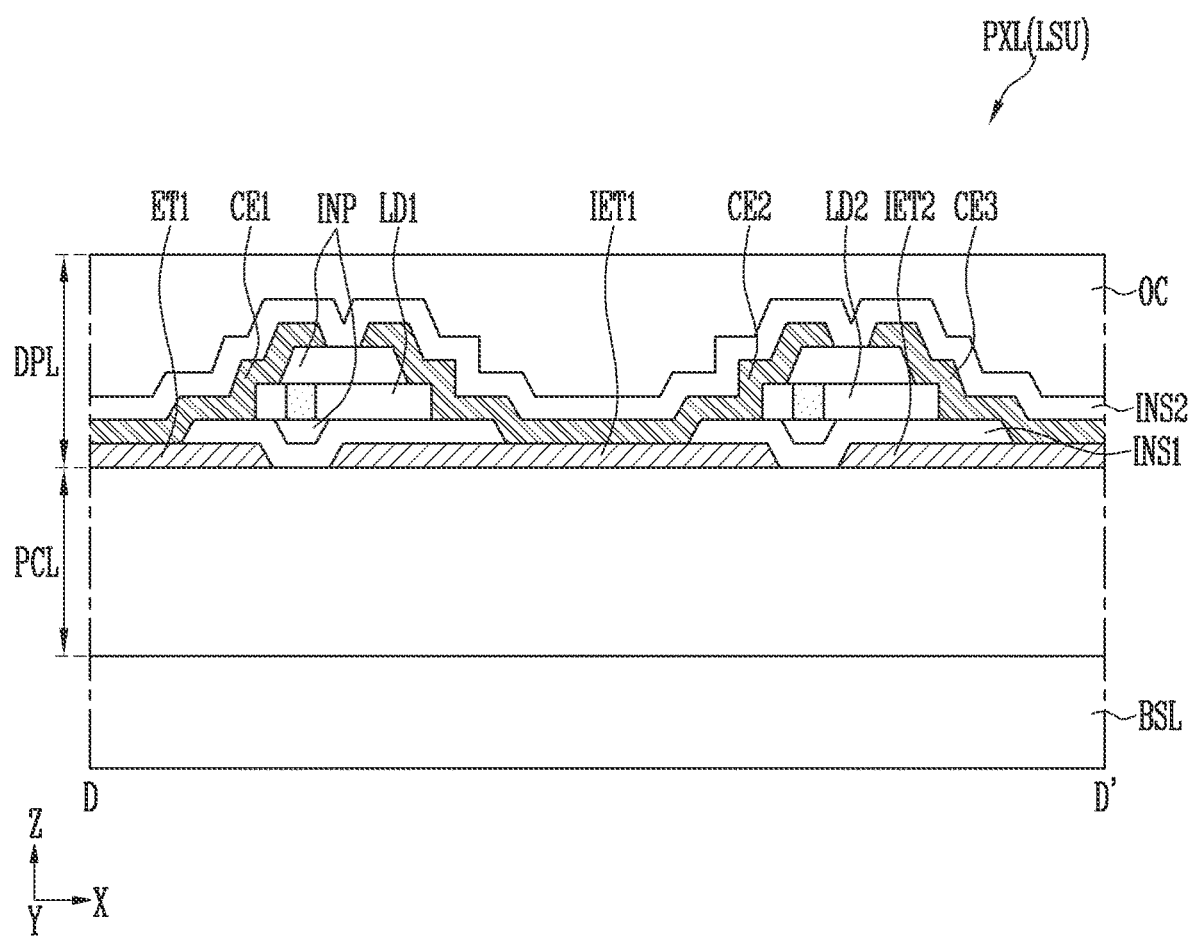
FIGS. 23 and 24 are cross-sectional views taken along the line D-D' of FIG. 22.
Figure 24:
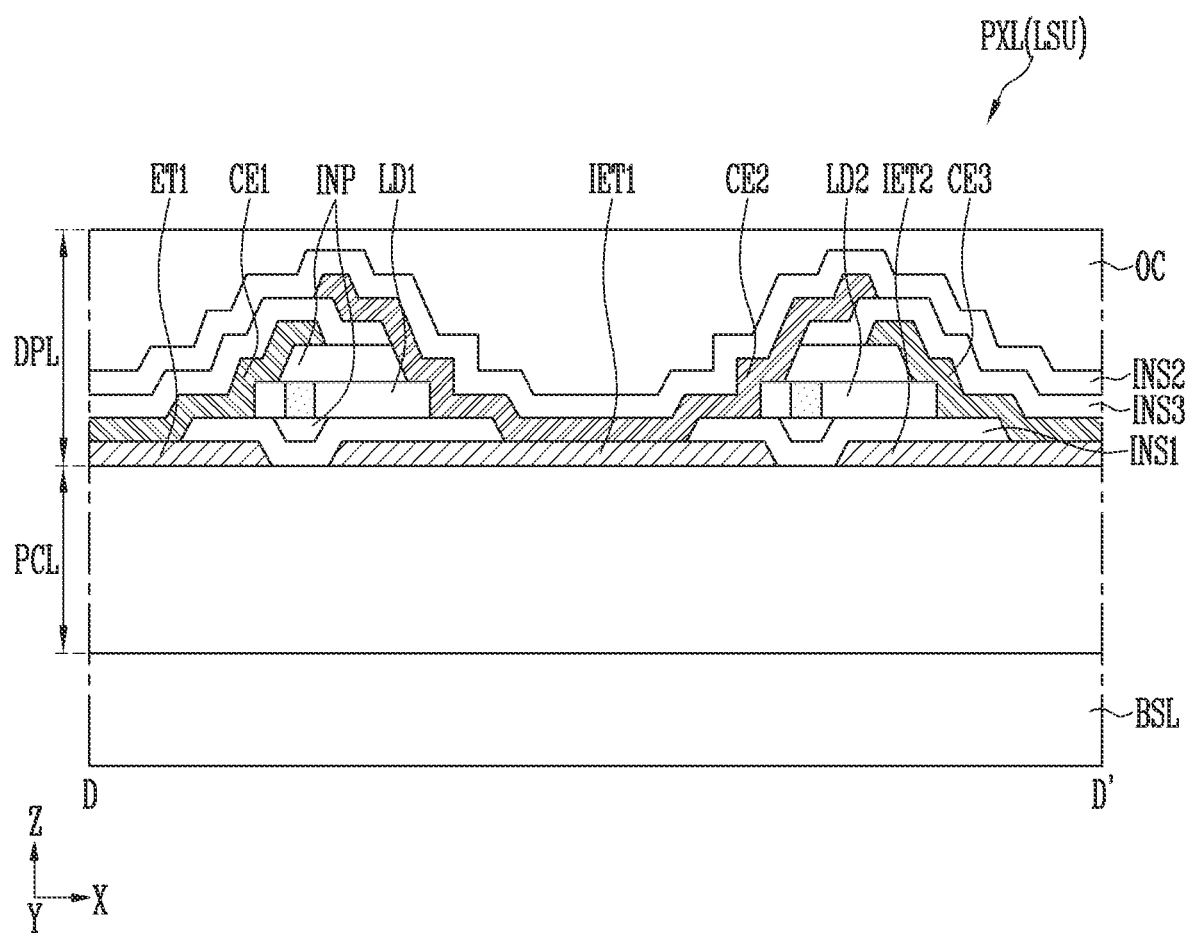

FIG. 22 is a plan view illustrating a pixel according to one or more other embodiments. FIGS. 23 and 24 are cross-sectional views taken along the line D-D' of FIG. 22.

In one or more embodiments of FIGS. 22 to 24, the same reference numerals are given to configurations similar to or identical to those of the above-described embodiments, and a repeated detailed description thereof is omitted.

The pixel PXL according to the present one or more embodiments is different from the one or more embodiments corresponding to FIGS. 19 to 21, in that a plurality of bank patterns are omitted.

For example, the first electrode ET1, the first intermediate electrode IET1, and the second intermediate electrode IET2 may be directly disposed on one surface of an uppermost surface (for example, the passivation layer PSV) of the circuit element layer PCL. The first electrode ET1, the first intermediate electrode IET1, and the second intermediate electrode IET2 may be flatly disposed along a shape of one surface of the uppermost surface (for example, the passivation layer PSV) of the circuit element layer PCL.

The light emitting elements LD may be disposed on the first electrode ET1, the first intermediate electrode IET1, the second intermediate electrode IET2, and the second electrode ET2, and the one end and the other end of the light emitting elements LD may be covered by the contact electrode CE. For example, one end of each of the adjacent contact electrodes CE may be disposed with the insulating pattern INP interposed therebetween, and may be disposed to be spaced apart on the one end and the other end of at least one adjacent light emitting element LD.

In one or more embodiments, the contact electrodes CE may be substantially simultaneously formed on the same layer on one surface of the base layer BSL as shown in FIG. 23. Accordingly, the manufacturing process of the pixel PXL and the display device including the same may be simplified.

In one or more other embodiments, the contact electrodes CE may be divided into a plurality of groups and may be sequentially formed on different layers on one surface of the base layer BSL for each group. For example, as shown in FIG. 24, a pair of adjacent contact electrodes CE may be sequentially formed on different layers on one surface of the base layer BSL. In this case, a third insulating layer INS3 may be additionally disposed between the pair of contact electrodes CE. That is, a position and a mutual disposition relationship of the contact electrodes CE may be variously changed.

In addition, the contact electrodes CE may cover one surface of the first electrode ET1, the first intermediate electrode IET1, the second intermediate electrode IET2, and the second electrode ET2 exposed by the first insulating layer INS1.

According to the present one or more embodiments, since the plurality of bank patterns in the pixel PXL may be omitted, an element density in the pixel PXL may be improved as described above.

Since other configurations are described with reference to FIGS. 19 to 21, an overlapping content is omitted.

Although the embodiments have been described above with reference to the accompanying drawings, those skilled in the art to which the present disclosure pertains will understand that the present disclosure may be carried out in other forms without changing the technical spirit or essential characteristics thereof. Therefore, it should be understood that the above-described embodiments are illustrative and not restrictive in all aspects.

The invention claimed is:

1. A display device comprising a plurality of pixels disposed in a display area, wherein each of the plurality of pixels comprises:
   a first electrode and a second electrode spaced apart from each other in a first direction; and
   at least one light emitting element disposed between the first electrode and the second electrode and electrically connected to the first electrode and the second electrode, and
   wherein a distance in the first direction between one end of the light emitting element and one end of the second electrode is greater than a distance in the first direction between another end of the light emitting element and one end of the first electrode.

2. The display device according to claim 1, wherein a width in the first direction of the second electrode is greater than a width in the first direction of the first electrode.

3. The display device according to claim 1, wherein the light emitting element comprises:
   a first semiconductor layer;
   a second semiconductor layer; and
   an active layer disposed between the first semiconductor layer and the second semiconductor layer,
   wherein the first semiconductor layer is electrically connected to the second electrode, and the second semiconductor layer is electrically connected to the first electrode.

4. The display device according to claim 3, wherein the first semiconductor layer overlaps the second electrode, and the second semiconductor layer overlaps the first electrode.

5. The display device according to claim 3, wherein an area in which the second electrode overlaps the first semiconductor layer is greater than an area in which the first electrode overlaps the second semiconductor layer.

6. The display device according to claim 3, wherein a distance in the first direction between the active layer and the one end of the first electrode is substantially the same as a distance in the first direction between the active layer and the one end of the second electrode.

7. The display device according to claim 1, wherein the plurality of the pixels further comprises:
   a first bank pattern disposed under the first electrode and overlapping the first electrode; and
   a second bank pattern disposed under the second electrode and overlapping the second electrode.

8. The display device according to claim 7, wherein a distance in the first direction between the one end of the second electrode and one end of the second bank pattern is greater than a distance in the first direction between the one end of the first electrode and one end of the first bank pattern.

9. The display device according to claim 7, wherein a distance in the first direction between the one end of the light emitting element and one end of the second bank pattern is substantially the same as a distance in the first direction between the other end of the light emitting element and one end of the first bank pattern.

10. The display device according to claim 7, wherein the light emitting element comprises:
    a first semiconductor layer;
    a second semiconductor layer; and
    an active layer disposed between the first semiconductor layer and the second semiconductor layer, and
    wherein a distance in the first direction between one end of the second bank pattern and the active layer is greater than a distance in the first direction between one end of the first bank pattern and the active layer.

11. A display device comprising a plurality of pixels disposed in a display area, wherein each of the plurality of pixels comprises:

a first electrode and a second electrode spaced apart from each other in a first direction;

at least one intermediate electrode disposed between the first electrode and the second electrode;

a first light emitting element disposed between the intermediate electrode and the first electrode; and a second light emitting element disposed between the intermediate electrode and the second electrode, and wherein an area in which the intermediate electrode and the first light emitting element overlap is greater than an area in which the intermediate electrode and the second light emitting element overlap.

12. The display device according to claim 11, wherein each of the first light emitting element and the second light emitting element comprises:

a first semiconductor layer;

a second semiconductor layer; and an active layer disposed between the first semiconductor layer and the second semiconductor layer.

13. The display device according to claim 12, wherein the intermediate electrode overlaps the first semiconductor layer of the first light emitting element.

14. The display device according to claim 12, wherein the intermediate electrode overlaps the second semiconductor layer of the second light emitting element.

15. The display device according to claim 12, wherein a distance in the first direction between one end of the intermediate electrode and one end of the first semiconductor layer of the first light emitting element is greater than a distance in the first direction between another end of the intermediate electrode and one end of the second semiconductor layer of the second light emitting element.

16. The display device according to claim 12, wherein a distance in the first direction between one end of the intermediate electrode and the active layer of the first light emitting element is substantially the same as a distance in the first direction between another end of the intermediate electrode and the active layer of the second light emitting element.

17. The display device according to claim 16, wherein the plurality of pixels further include a bank pattern disposed under the intermediate electrode.

18. The display device according to claim 17, wherein a distance in the first direction between the one end of the intermediate electrode and one end of the bank pattern is greater than a distance in the first direction between the other end of the intermediate electrode and another end of the bank pattern.

19. The display device according to claim 17, wherein a distance in the first direction between one end of the bank pattern and one end of the first light emitting element is substantially the same as a distance in the first direction between another end of the bank pattern and one end of the second light emitting element.

20. The display device according to claim 17, wherein each of the first light emitting element and the second light emitting element comprises:

a first semiconductor layer;

a second semiconductor layer; and an active layer disposed between the first semiconductor layer and the second semiconductor layer, wherein a distance in the first direction between the active layer of the first light emitting element and one end of the bank pattern is greater than a distance in the first direction between the active layer of the second light emitting element and another end of the bank pattern.

* * * * *